United States Patent [19]

Juri

[11] Patent Number: 5,073,821
[45] Date of Patent: Dec. 17, 1991

[54] ORTHOGONAL TRANSFORM CODING APPARATUS FOR REDUCING THE AMOUNT OF CODED SIGNALS TO BE PROCESSED AND TRANSMITTED

[75] Inventor: Tatsuro Juri, Osaka, Japan

[73] Assignee: Matsushita Electric Industrial Co., Ltd., Osaka, Japan

[21] Appl. No.: 535,027

[22] Filed: Jun. 8, 1990

[30] Foreign Application Priority Data

Jan. 30, 1989 [JP] Japan .................................. 1-20009
Jun. 9, 1989 [JP] Japan .................................. 1-147891
Aug. 4, 1989 [JP] Japan .................................. 1-203285
Jan. 11, 1990 [JP] Japan .................................. 2-4152

[51] Int. Cl.$^5$ .............................................. H04N 7/13
[52] U.S. Cl. ..................................... 358/133; 358/13; 358/135
[58] Field of Search ................... 358/133, 13, 135, 136, 358/432, 433; 364/725; 382/56

[56] References Cited

U.S. PATENT DOCUMENTS 4,234,767 3/1988 Kaneko et al. ..................... 358/133
5,006,929 4/1991 Barbero ............................... 358/136

Primary Examiner—Victor R. Kostak
Attorney, Agent, or Firm—Wenderoth, Lind & Ponack

[57] ABSTRACT

An orthogonal transform coding device assembles sample values of the input signals and forms a large block. The large block is divided into a plurality of small blocks and the sample values are subjected to the orthogonal transform coding for every small block. A plurality of quantizers are provided for the orthogonal transformed components and the data amount after coding when the quantization performed by the respective quantizers is estimated, whereby the optimum quantizers are selected for the respective small blocks according to the estimated value.

39 Claims, 25 Drawing Sheets

Fig. 15

|   | low frequency range | | | | high frequency range (horizontal) → | | | |
|---|---|---|---|---|---|---|---|---|
|   | 0 | 1 | 2 | 3 | 4 | 5 | 6 | 7 |
| 0 | 1 | 3 | 4 | 10 | 11 | 21 | 22 | 36 |
| 1 | 2 | 5 | 9 | 12 | 20 | 23 | 35 | 37 |
| 2 | 6 | 8 | 13 | 19 | 24 | 34 | 38 | 49 |
| 3 | 7 | 14 | 18 | 25 | 33 | 39 | 48 | 50 |
| 4 | 15 | 17 | 26 | 32 | 40 | 47 | 51 | 58 |
| 5 | 16 | 27 | 31 | 41 | 46 | 52 | 57 | 59 |
| 6 | 28 | 30 | 42 | 45 | 53 | 56 | 60 | 63 |
| 7 | 29 | 43 | 44 | 54 | 55 | 61 | 62 | 64 | high frequency range (vertical) ↓

ORTHOGONAL TRANSFORM CODING APPARATUS FOR REDUCING THE AMOUNT OF CODED SIGNALS TO BE PROCESSED AND TRANSMITTED

BACKGROUND OF THE INVENTION

1. Field of the Invention

The present invention relates to an apparatus for orthogonal transform coding for use in reducing the amount of coded signals to be processed and transmitted.

2. Description of the Prior Art

High efficiency coding has been important with development of digital technology of picture signals. As the high efficiency coding technology, there has been known orthogonal transform coding, in which input time sequential signals are transformed to different signals of an orthogonal function such as frequency component. As the orthogonal transformation, a Fourier transformation, a discrete cosine transformation (DCT) and an Hadamard transformation are well known. Especially, DCT has been noticed as the orthogonal transform suitable for processing the picture information.

An example of the high efficiency coding will be explained hereinafter with reference to FIG. 1 showing an example of a conventional high efficiency coding device in which element 1 is an input unit; element 2 is a block generating unit; element 3 is a DCT unit; element 4 is an adaptive quantizer; element 5 is a variable length encoder; element 6 is a data buffer and element 7 is an output unit.

In the encoding device shown in FIG. 1, the digital image signals input from the input unit 1 are separated into blocks on a DCT unit basis in the block generating unit 2. In the high efficiency coding of the image picture, a two dimensional DCT for a block constructed by a total 64 picture elements made of the horizontal 8 × vertical 8 samples is often used. The blocked image signals are transformed by a two dimension DCT in the DCT unit 3 and DCT components of the image signals can be obtained. The DCT components are quantized in the adaptive quantizer 4 and are subsequently encoded the variable length code in the variable length encoder 5; furthermore, the code rate of the encoded image signals is adjusted to a predetermined rate in the data buffer 6 and the image signals are output from the output unit 7.

The variable length encoding is a way of coding in which a word of higher generation probability is assigned a shorter code and a word of lower generation probability is assigned a longer code. Table 1 shows correspondence between the three bit data 0, 1, 2 . . . 7 and their variable length codes. In the examples, numbers 0 and 1 are assigned 2 bit codes, 2 and 3 are assigned 3 bit codes and 4, 5, 6 and 7 are assigned 4 bit codes.

TABLE 1

| data | variable length code |
|---|---|
| 0 | 00 |
| 1 | 01 |
| 2 | 100 |
| 3 | 101 |
| 4 | 1100 |
| 5 | 1101 |
| 6 | 1110 |

TABLE 1-continued

| data | variable length code |
|---|---|
| 7 | 1111. |

Since the data of the result of a DCT transform shows an usually exponential distribution, the generation probability of 0 and 1 is much greater than that of 4, 5, 6 and 7, and the averages bit number of data after the coding is smaller than 3 bits. It is noted that when the variable length coding is used, the data rate after the coding may change depending on the picture quality. Due to the facts mentioned above, in the conventional device shown in FIG. 1, in order to prevent an overflow or underflow in the data buffer 6, the adaptive quantizer 4 increases the quantization width when the amount of the data in the data buffer 6 increases and decreases the quantization width when the data amount in the data buffer 6 is decreased.

The conventional DCT coding device as mentioned above shows drawbacks as mentioned hereinafter.

(1) Since the variable length coding is used, even if 1 error bit occurs, word synchronization is disturbed, although it depends on the transmission line, and the decoding of data is prevented. Such a word transmission error causes the picture to be deteriorated remarkably. Therefore, it is difficult to employ the conventional DCT device, in particular, in devices wherein transmission errors occurs in a high probability such as a VTR.

(2) In order to maintain the data rate constant, conventionally there is used a feedback system using a buffer. However, actual image data may have a data unbalance and it is difficult to obtain optimum coding by the feedback technique. In particular, in a case where the information of the front half data row is small and that of the rear half is large, unnecessary data are assigned to the front half, whereby the data becomes insufficient, resulting in a remarkable picture deterioration.

(3) In a case where the amount of the image information is large in the high efficiency coding using DCT, distortion due to quantization increases and block distortion may be generated.

SUMMARY OF THE INVENTION

An essential object of the present invention is to provide an orthogonal transform coding device which can transform the signals with a decrease in the undesired effects due to the transmission errors occurring in the variable length coding system and can improve the picture quality in the high efficiency coding device.

In order to accomplish the object mentioned above, according to the present invention, there is provided an orthogonal transform coding device which comprises: a large block generating means for assembling sample values of input signals to form a large block of the sampled input signals; a small block generating means for dividing the large block formed in the large block generating means into a plurality of small blocks; an orthogonal transform means for orthogonally transforming the signals in each block; a first quantizing means having a plurality of kinds of quantizers each of which quantizes the orthogonally transformed components provided in said transforming means; a data amount estimating means for calculating an amount of data obtained after the quantizing is effected in the first quantizing means; a selection means for selecting an optimum quantizer in the quantizing means for every small block corresponding to the result of the calculation of the data amount of every small block by the data amount calculating means; a second quantizing means for quantizing the orthogonally transformed component in the large block; a coding means for converting the quantized value obtained in the second quantizing means into variable length coded data; and a transmission means for transmitting the variable length coded data with the information of the selected quantizer.

In the orthogonal transform coding device as mentioned above, the coded data amount is previously estimated so that the optimum quantizer can be selectively employed for quantizing the orthogonally transformed data in the large block. In addition, since it is possible to control the amount of the data precisely, which is different from the conventional feedback control, the variable length coding can be accomplished so that predetermined length of code can be realized in a small range, whereby it is possible to use the variable length coding in such devices as digital VTRs where transmission errors often occur.

BRIEF EXPLANATION OF THE DRAWINGS

FIG. 15 is a schematic diagram showing an example of the order of data transmission used in a second example of the transmission unit;

DETAILED DESCRIPTION OF THE PREFERRED EMBODIMENTS

Figure 1:
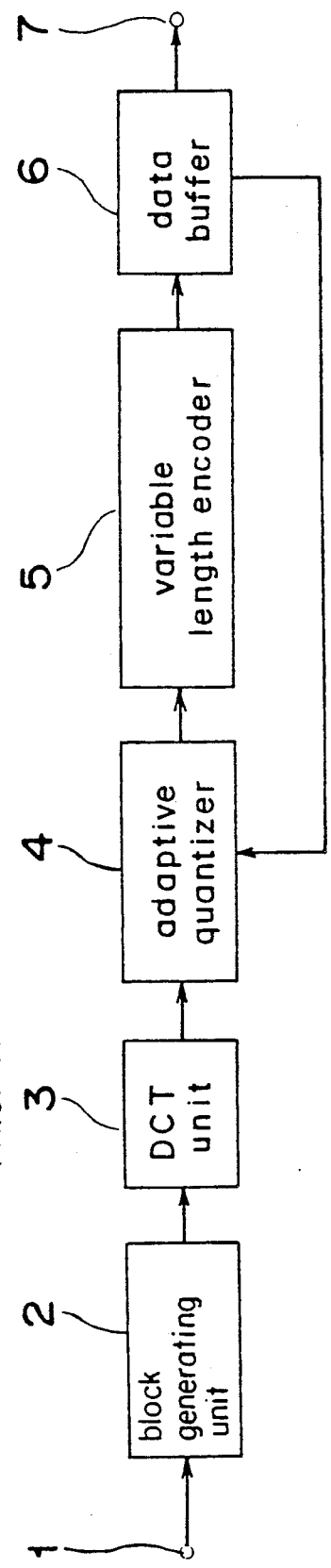
FIG. 1 is a block diagram showing an example of a conventional orthogonal transform coding device.
Figure 2:
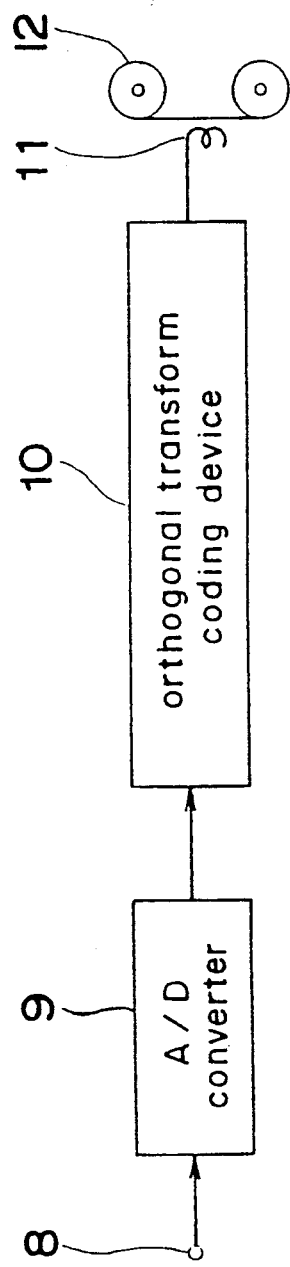
FIG. 2 is a block diagram showing an embodiment of a digital VTR to which the orthogonal transform coding device according to the present invention is applied.

FIG. 2 shows a general structure of an example of a digital video tape recorder (referred to as a VTR hereinafter) to which an orthogonal transform coding device according to the present invention is employed. In FIG. 2, reference numeral 8 denotes an input terminal of the device; element 9 is an analog digital converter (A/D converter); element 10 is an orthogonal transform coding device accoriding to the present invention; element 11 is a magnetic recording head of the digital VTR and element 12 is a magnetic recording tape. Television signals in an analog form fed from the input terminal 8 are converted into sample values of digital picture signal in the A/D converter 9. The sample values of the digital picture signals are subjected to data compression in the orthogonal transform coding in the orthogonal transform coding device 10, whereby the compressed data is recorded on the magnetic tape 12 through the magnetic recording head 11. To employ the orthogonal transform coding device according to the present invention in a picture recording device or picture transmission device such as a digital VTR enables one to decrease the data rate and to increase the recording time.

Figure 3:
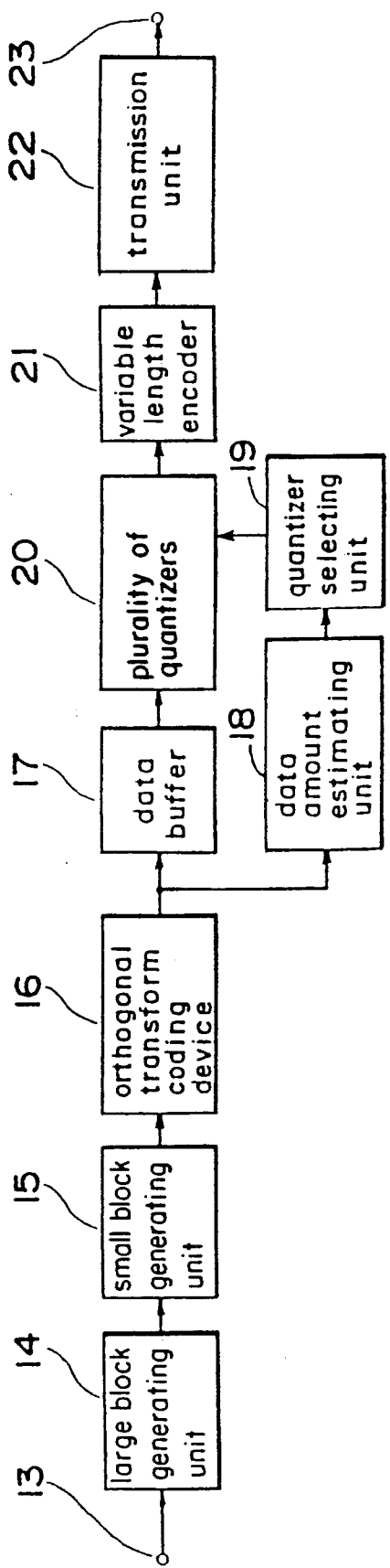
FIG. 3 is a block diagram showing an example of the orthogonal transform coding device according to the present invention.

Referring to FIG. 3 showing a block diagram of the orthogonal transform coding device according to the present invention, element 13 is an input terminal of the device; element 14 is a large block generating unit; element 15 is a small block generating unit; element 16 is an orthogonal transform coding device; element 17 is a data buffer; element 18 is a data amount estimating unit; element 19 is a quantizer selecting unit; element 20 is a plurality of quantizers; element 21 is a variable length encoder; element 22 is a transmission unit and element 23 is an output terminal. The picture signals in digital form fed from the input terminal 13 divided by the large block generating unit 14 into a pluarality of large blocks each of which comprises a plurality of sample values.

Each of the large blocks is further divided into a plurality of small blocks in the small block generating unit 15. Each of small blocks comprises a sampled value of the picture data for depicting a rectangular shape on a picture plane of a display unit of a VTR. The sample values divided into small blocks are orthogonally transformed in the orthogonal transform coding device 16. The orthogonal components orthogonally transformed from the sample values are inputted to the buffer 17 and data amount estimating unit 18 on a large block basis. In the data amount estimating unit 18, the amount of data of coded orthogonal components in every small block is calculated for a plurality of quantizers previously prepared, and then one of the quantizers is selected for every small block in the quantizer selecting unit 19 based on the result of the calculation. The orthogonal components inputted to the buffer 17 are delayed therein until the quantizer is selected. The orthogonal components are quantized in the selected quantizers 20 and the quantized orthogonal components are coded into the variable length form in the variable length encoder 21 The quantized values coded into the variable length form are fed to the output terminal 23 through the transmission unit 22.

As mentioned above, in the present invention, by estimating the amount of data before quantization, it becomes possible to select the optimum quantizer. Also since it is possible to control the amount of data accurately in a fashion which is different from the feedback control used in the prior art, it becomes possible to encode the data in the variable length form of a constant length of a small range, whereby the variable length coding can be employed in the digital VTR in which transmission errors occur frequently.

The detailed operation of the respective components shown in FIG. 3 are explained hereinafter.

Figure 4:
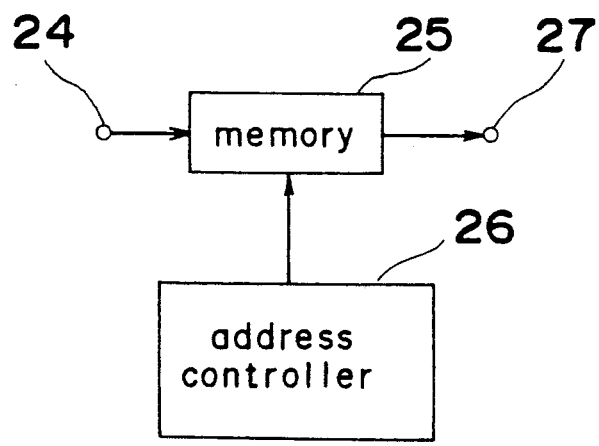
FIGS. 4 to 8 are respectively block diagrams showing various examples of the large block generating unit used in the device according to the present invention.

The large block generating unit is explained first with reference to FIG. 4 showing detailed structure of the large blocking unit. Element 24 is an input terminal; element 25 is a memory; element 26 is an address controller, and element 27 is an output terminal. The sample value inputted from the input terminal is inputted to the memory 25 and outputted to the output terminal 27 according to the control of the address controller 26. As mentioned above, in the large block generating unit 14, the input signals are stored in the memory 25 and outputted every large block.

In the first example, the large block generating unit is so constructed that the address controller 26 shown in FIG. 4 forms every large block with every one field data of the television signals, whereby it becomes possible to form the memory 25 by a small memory in the field. In addition, for the moving picture, it is possible to compress the data every field so that the compressing effect can be improved.

Figure 5:
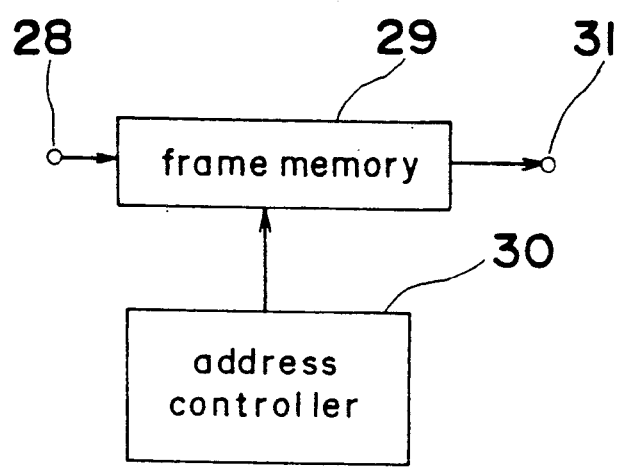

FIG. 5 shows the second example of the large block generating unit 14 in which element 28 is an input terminal; element 29 is a frame memory; element 30 is an address controller, and element 31 is an output terminal. The sample values are inputted to the frame memory 29 and outputted to the output terminal 31 according to the control of the address controller 30. In the second example, by employing the frame memory, every large block is formed by signals of a plurality of fields of the television signals, whereby it becomes possible to compress the data using the redundancy between the fields, and accordingly, a higher compression rate can be realized.

Figure 6:
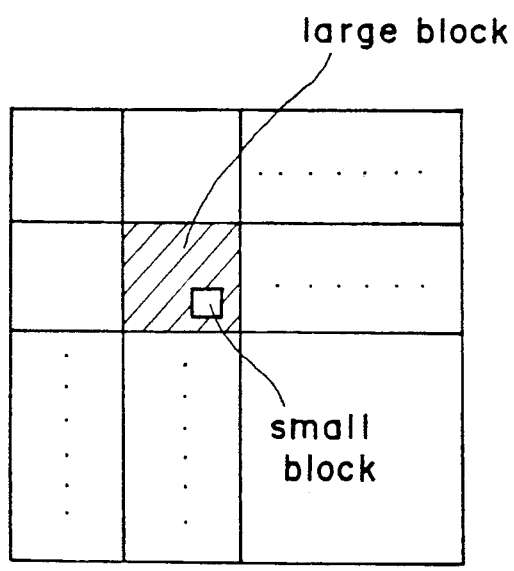

FIG. 6 shows the third example of the large block generating unit 14 in which every large block is formed by signals of adjacent picture elements on the picture plane. Since the small blocks in the large block are adjacent each other, it becomes possible to compress the data using the redundancy between the small blocks. Such large block generation, as shown in FIG. 6, can be realized by controlling the output address of the address controller 28 in the circuit shown in FIG. 4.

Figure 7:
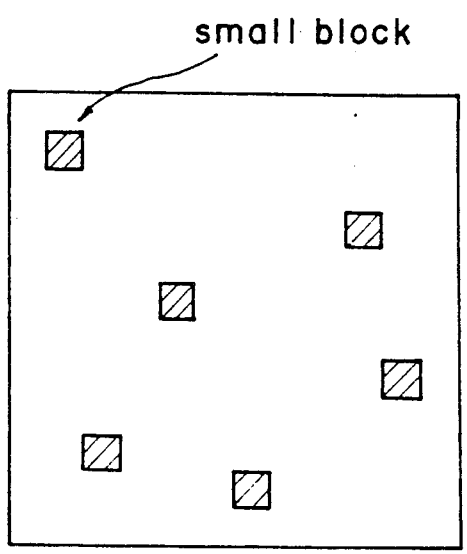

FIG. 7 is a schematic drawing for explaining the fourth example of the large blocking unit 14, in which the shaded blocks show small blocks. An assembly of the shaded small blocks forms a large block. As mentioned above, in the fourth example of the large block generating unit, the large block is formed by assembling small blocks situated on various positions on the picture plane in a shuffling manner, whereby the amount of information contained in the respective large blocks is substantially equal since the amount of information on the picture plane is scattered. Accordingly, it is possible to compress the data at a high efficiency, even if the amount of information is widely separated by position on the picture plane. Moreover, since the data rate of the words of the compressed codes is averaged, it is easy to control the data amount so as to be constant on a large block basis. Such blocking can be made by controlling the output address in the address controller 26 in the circuit shown in FIG. 4.

Figure 8:
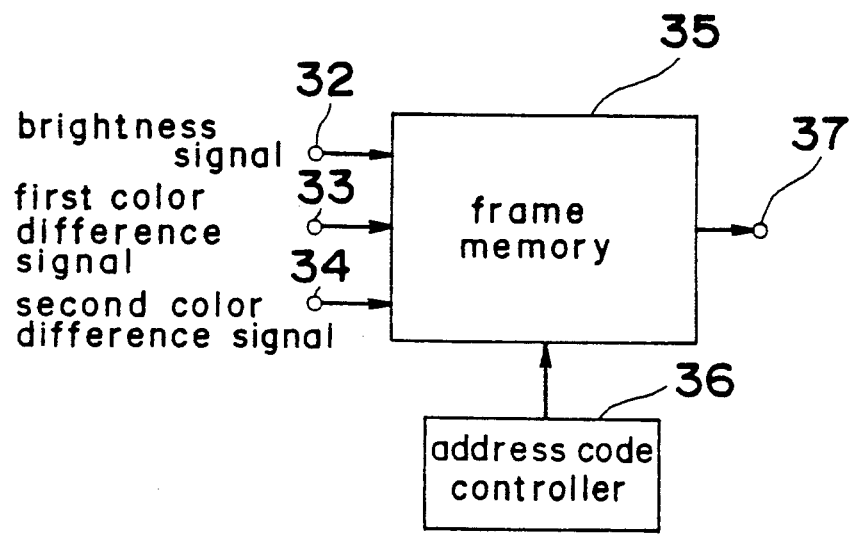

FIG. 8 shows the fifth example of the large block generating unit 14 in which element 32 is a brightness signal input terminal; element 33 is a first color difference signal input terminal; element 34 is a second color difference signal input terminal; element 35 is a frame memory; element 36 is an address code controller, and element 37 is an output terminal. The respective samples of the input signals of the brightness signal, the first color difference signal and second color difference signal fed from the input terminals 32, 33 and 34 are inputted to the frame memory 35 and outputted to the output terminal 37 according to the control of the address controller 36. In the fifth example, each of the large block is formed by the brightness signals, the first color difference signal and second color difference signals containing them substantially at the same rate. In general, the amount of information of the brightness signals and the color difference signals is unbalanced. Since each large block includes the same rate of the brightness signals and the first and second color difference signals, it becomes possible to average the amount of information similar to the fourth example of the large block generating unit. In the case where the input signals are R, G and B signals, by causing all of the large blocks to include the same rate of R, G and B signals enables one to average the amount of information.

The details of the small block generating unit are explained hereinafter.

The small block generating unit is a unit for dividing the sample values of each of the large blocks into blocks for orthogonal transforming. The circuit for the small block generating is substantially the same as the circuit for the large block generating unit as shown in FIG. 4 which comprises a memory and address controller. However, it is noted that the small block generating unit can be formed with a relatively decreased memory capacity as compared to that of the large block generating unit. In practical use, the large block generating unit and the small block generating unit may be constructed by one memory and one address controller to decrease the circuit scale. Similar to the large block generating unit, the small block generating unit may be formed by various shapes. The examples of the small block generating unit are mentioned hereinafter.

In the first example of the small block generating unit, the small block is formed by the signals only in the field, whereby since the small blocks and the large blocks can be formed by the small memory in the field, the circuit scale can be made small. In the moving picture of hard motion, it is possible to decrease distortion by the in-field processing.

In the second example of the small block generating unit, the small block is formed by the signals of a plurality of consecutive fields, whereby it is possible to compress the data for eliminating the redundancy between the fields. Especially the above advantage can be obtained in pictures containing little motion. Both of the first and second examples can be realized by control of the address controller of the device shown in FIG. 4.

Figure 9:
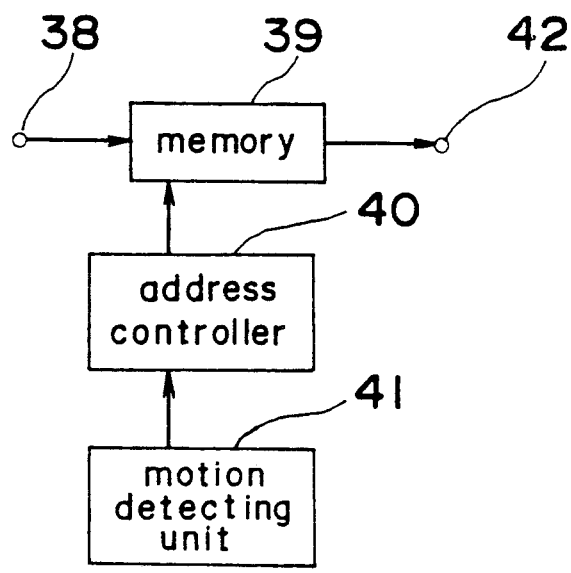
FIG. 9 is a block diagram showing an example of the small block generating unit used in the device according to the present invention.

FIG. 9 is a schematic diagram showing the third example of the small block generating unit, in which element 38 is an input terminal; element 39 is a memory; element 40 is an address controller; element 41 is a motion detecting unit and element 42 is an output terminal. The signals inputted through the input terminal 38 are stored in the memory 39. The address controller 40 operates in response to the signal of the motion detecting unit 41 to form the small block either by the signals within one field when the motion is large or by the signals of two consecutive fields or more than two fields when the motion of the picture is small; the formed small blocks are outputted from the output terminal 42, whereby it is possible to compress the data with small distortion regardless of whether the picture is a moving picture or a still picture.

Next, the orthogonal transform coding unit 16 is explained. For the sake of brevity, an example of an orthogonal transform is made by DCT using a small block consisting of 64 picture elements consisting of 8 horizontal picture elements×8 vertical picture elements.

Figure 10:
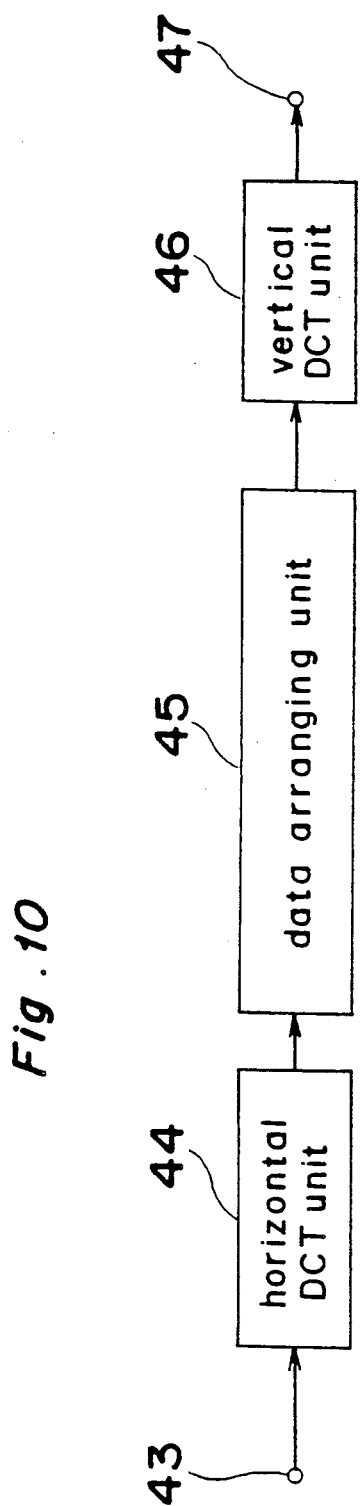
FIG. 10 is a block diagram showing an example of the orthogonal transform unit used in the present invention.
Figure 11:
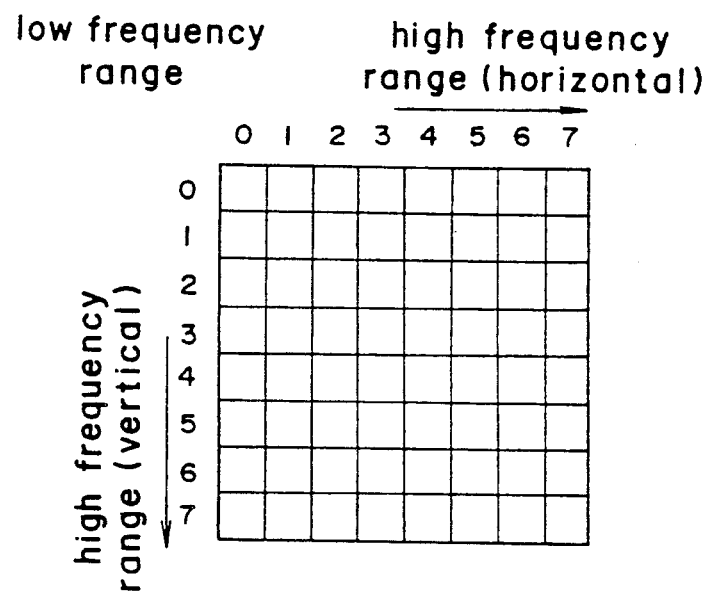
FIGS. 11 and 13 are schematic diagrams showing an example of quantized values of the orthogonal transformed values.

Referring to FIG. 10, element 43 is an input terminal of the sample value of the small block; element 44 is a horizontal DCT unit for discrete transforming in the horizontal direction; element 45 is a data arranging unit for arranging horizontally line data into vertically lined data; element 46 is a vertical DCT unit, and element 47 is an output terminal. The sample values obtained in the small block generating unit 15 are inputted to the input terminal 43, and discretely transformed in the horizontal direction in the horizontal DCT unit 44. The orthogonal components which are transformed in the DCT unit are arranged in the vertical direction in the data arranging unit 45. The arranged orthogonal components are discrete transformed in the vertical direction and outputted from the output terminal 47. Both the horizontal and vertical orthogonal components of every small block which have been subjected to the DCT transforming in the horizontal direction and vertical direction are inputted to the buffer 17 and the data estimating unit 18 shown in FIG. 3 in the order of the orthogonal components representing the low frequency range.

Although the above examples are described in connection with the two dimensional DCT, in the present invention, various kinds of DCT can be employed, for example, three dimensional DCT containing time axis DCT can be used. The simplest example of the three dimensional DCT device is shown in FIG. 12.

Figure 12:
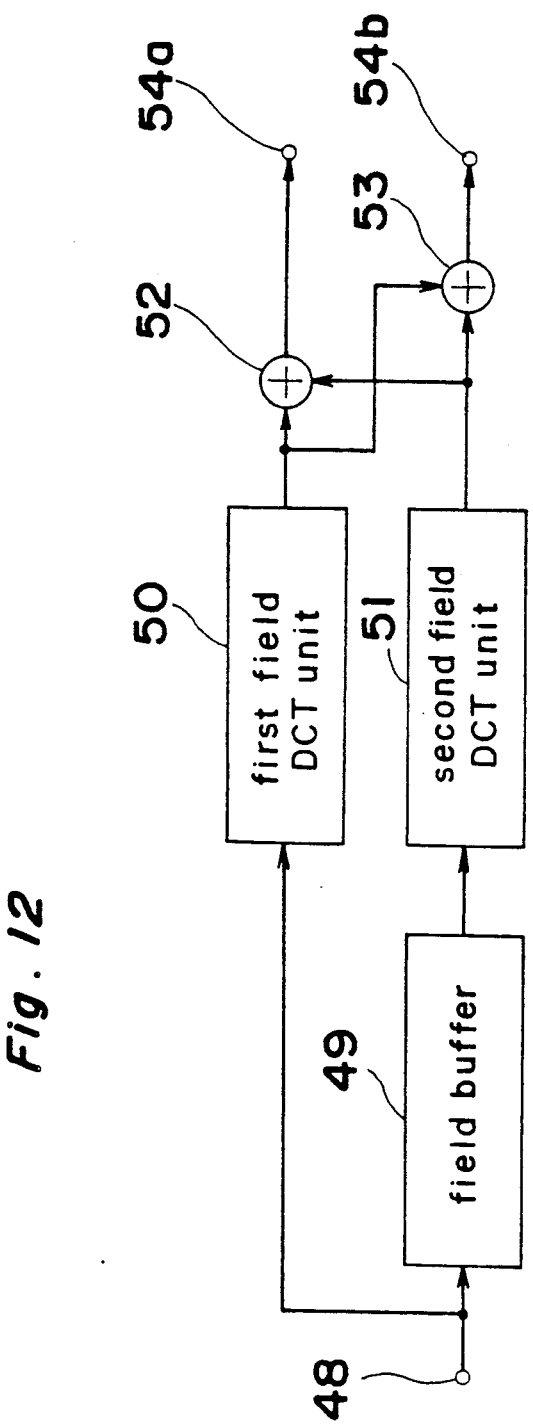
FIG. 12 is a block diagram of an example of a 3 dimensional orthogonal transform unit.

In FIG. 12, element 48 is an input terminal; element 49 is a field buffer; element 50 is a first field DCT unit; element 51 is a second field DCT unit; element 52 is an adder; and element 53 is a subtracter. Elements 54a and 54b are output terminals. The signals inputted from the input terminal 48 are processed in a two dimension DCT transformation in the first field DCT unit 50 and are also inputted simultaneously to the field buffer 49 in which the signals are delayed by one field. The signals delayed by one field are processed in a two dimensional DCT transformation in the second field DCT unit 51. The output signals of the first field DCT unit 50 and second field DCT unit 51 are added in the adder 52 and are subtracted in the subtracter 53 and the result of both calculations are outputted from the output terminals 54a and 54b. In the example shown in FIG. 12, the DCT transformed components situated at the same spatial position on the picture plane but in two different fields are added on one hand and subtracted on the other hand. In this case, the added components are processed to quantization in a quantizer of a small quantization range and the subtracted components are processed to quantization in a quantizer of a large quantization range, whereby it is possible to compress the data amount, thereby suppressing picture distortion. To calculate the sum and difference of the data is a lowest dimension (2 dimension) orthogonal transformation, it is possible to perform higher DCT by using information of more fields. As the field buffer, there may be commonly used the memory for the large blocking unit.

The transmission unit is explained below in detail.

Figure 13:
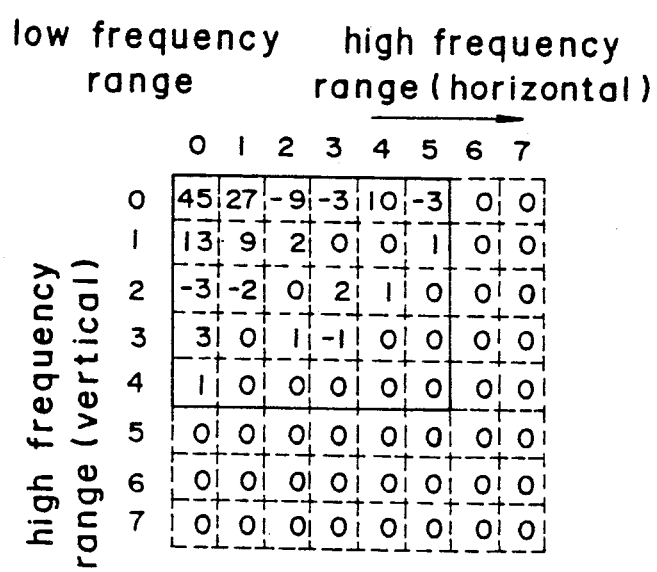

FIG. 13 shows example of the quantized values of the 2 dimension DCT transformed values. The transmission unit 22 is adapted to transmit the portion in FIG. 13 surrounded by the smallest rectangle (the portion surrounded by the solid lines in FIG. 13) containing all of only the non-zero quantized data making the lowest frequency component (the quantized values at the position of horizontal 0 and vertical 0) in the horizontal direction and vertical direction as an origin. It is noted that the data on the origin are always transmitted. Accordingly, the transmission range of the block (the rectangular shape in FIG. 13) is decided by the position of the matrix shown in FIG. 13 on which non-zero highest frequency components in the horizontal direction and the vertical direction exist. The number of the quantized values to be transmitted is decided by the area of the transmission range; therefore, the number of quantized values can be calculated by the product of the position of the highest frequency in the horizontal direction and the highest frequency in the vertical direction. In the example, the information of the transmission range can be represented by a horizontal coordinate of 3 bits and a vertical coordinate of 3 bits, for a total of 6 bits. Accordingly, the data amount after the coding of each small block is the sum of the variable length coded word contained in the transmission range and the information of the transmission range. The structure of the first example of the transmission unit will be explained hereinafter.

Figure 14:
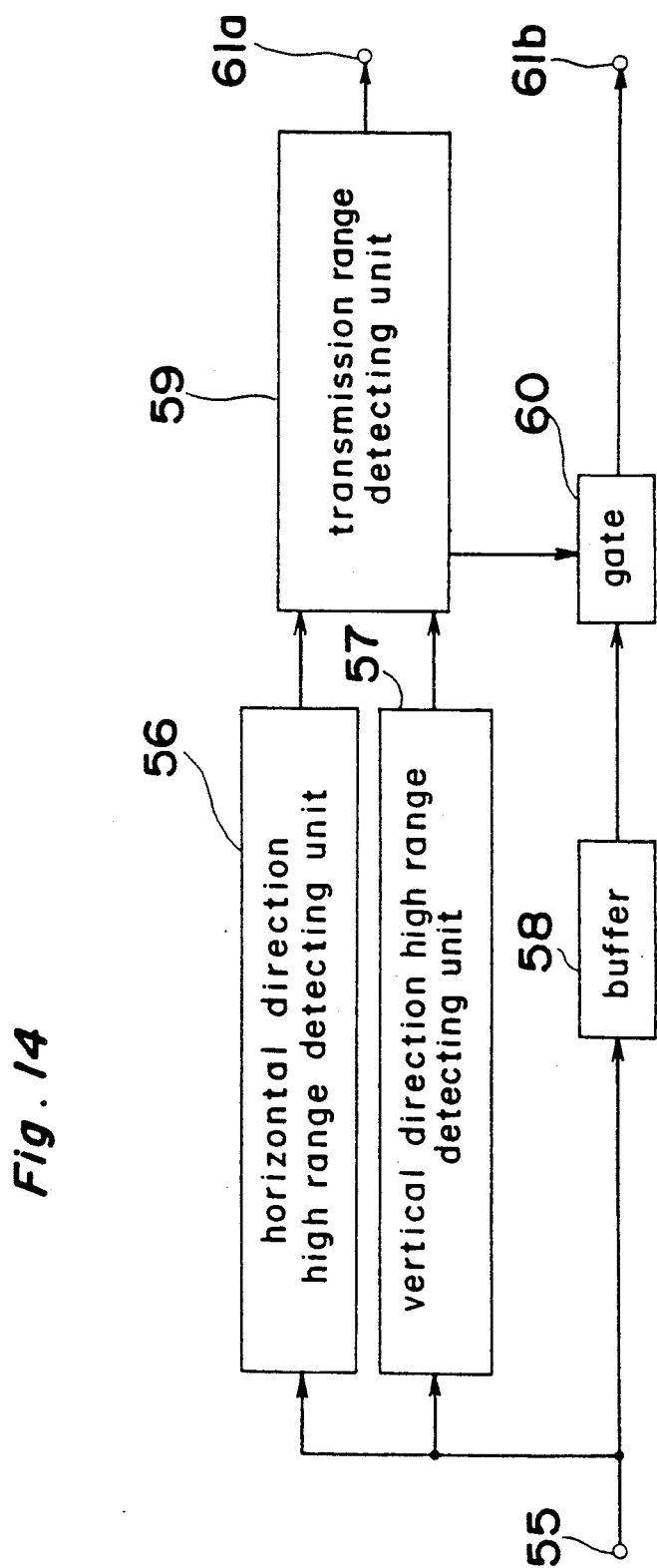
FIG. 14 is a block diagram showing an example of the transmission unit.

In. FIG. 14, element 55 is an input terminal; element 56 is a horizontal direction high range detecting unit; element 57 is a vertical direction high range detecting unit; element 58 is a buffer; element 59 is a transmission range detecting unit, and element 60 is a gate. Elements 61a and 61b are output terminals.

The quantized values inputted from the input terminal 55 are applied to the horizontal direction high range detecting unit 56 and the vertical direction high range detecting unit 57. In the horizontal direction high range detecting unit 56, there is detected a position on which the highest frequency component of non-zero quantized values in the horizontal direction exits. In the vertical direction high range detecting unit 57, there is detected a position on which the highest frequency component of non-zero quantized values in the vertical direction exists. The position thus detected is made as the origin of the rectangular shape shown in FIG. 13.

Using the outputs of the respective high range detecting units 56 and 57, the transmission range detecting unit 59 causes the gate 60 to pass only the quantized values in the transmission range among the quantized values temporarily stored and delayed in the buffer 58 by a predetermined time to the output terminal 61b. the transmission range detecting unit 59 outputs the information representing the transmission range from the output terminal 61a.

FIG. 15 shows a second example of the order of the transmission of the quantized values by the transmission unit. In the second example, the orthogonally transformed components are encoded in the order of the numbers shown in FIG. 15 from the lowest frequency component in the horizontal direction and the vertical direction in the small block and are transmitted, the coded word after the quantized value representing the highest frequency of the non-0 quantized values are replaced by the code representing the end of transmission. By this process, since it is possible to concentrate the high range values which have high generation probability of 0 to the rear half, it is possible to elongate the length of the consecutive 0s. In place of the end of transmission mentioned above there may be used information representing the final coded word.

Figure 16:
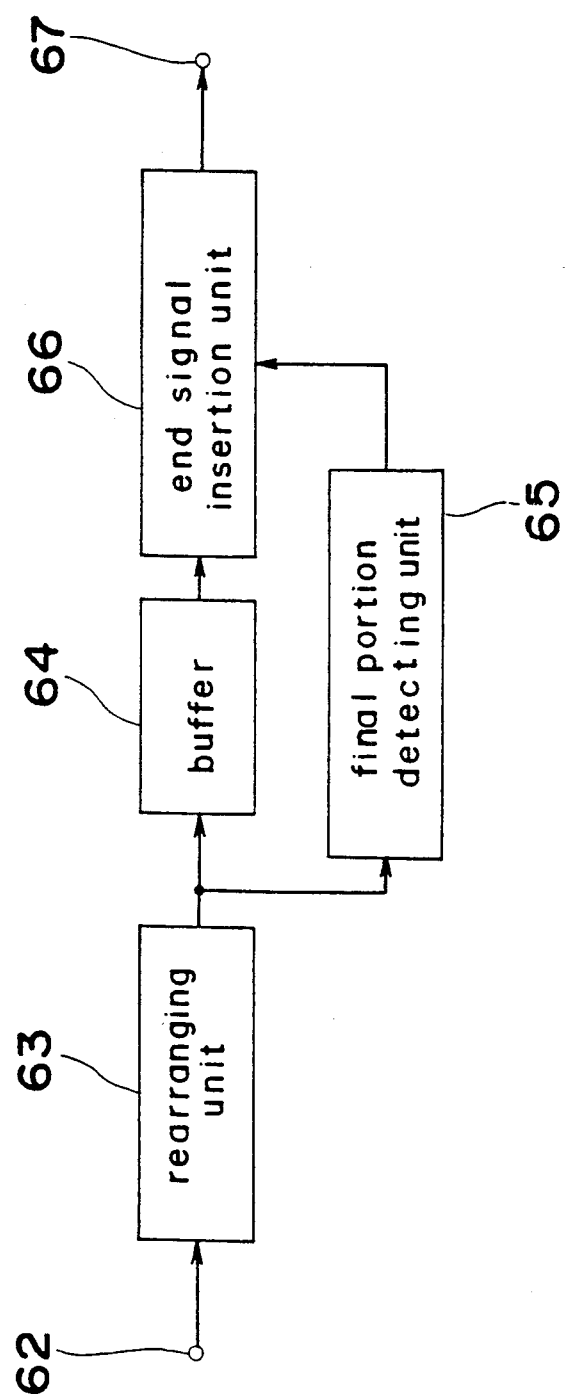
FIG. 16 is a block diagram showing a second example of transmission unit.

FIG. 16 shows a second example of the transmission unit. In FIG. 16, element 62 is an input terminal; element 63 is a rearranging unit; element 64 is a buffer; element 65 is a final portion detecting unit; element 66 is a end signal insertion unit, and element 67 is an output terminal. The quantized values inputted from the input terminal 62 are rearranged in the order shown in fig. 15 in the rearranging unit 63 and further inputted in the buffer 64. The final portion detecting unit 65 detects the position of the non-0 final quantized value from among the rearranged quantized values. In the quantized values outputted from the buffer 64, the final consecutive quantized 0s are replaced by the end signal in the end signal insertion unit 66 according to the information from the final portion detecting unit 65.

Figure 17:
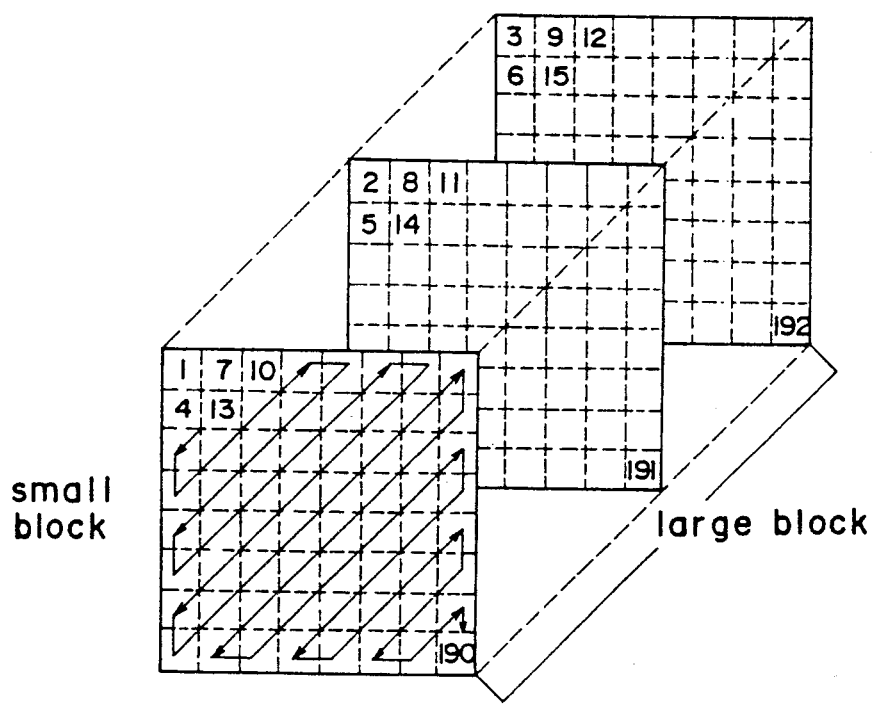
FIG. 17 is a schematic diagram showing an example of the order of data transmission used in a third example of the transmission unit.

FIG. 17 shows an example of the transmission order by a third example of the transmission unit. FIG. 17 is an example in which the large block consists of three small blocks. In the respective small blocks, the left upper portions represent the low frequency range of the orthogonal components and the right lower portions represent the high frequency range of the orthogonal components. the respective numeric characters in FIG. 17 show the transmission order of the orthogonal components in the position. The respective components are transmitted sequentially from the lowest components in the large block basis. By the transmission order mentioned above, it is possible to concentrate the high frequency components in the rear half in the large block basis. Accordingly, it is possible to elongate the length of the consecutive 0s. The third example of the transmission unit can be realized by rearranging the large blocks in the rearranging unit 63 in FIG. 16.

In the transmission unit mentioned above, if the data amount after the coding is too much and it becomes impossible to transmit all of the coded words, the high frequency components which in the transmission order are to the rear can not be transmitted. However, the picture distortion of the high frequency range is unclear for the human eyes, and the picture deterioration can be maintained at a minimum. On the other hand, if the coded word in the rear half portion can not be decoded due to the error in the transmission path and is out of synchronization, the effects of such an error mainly occurs in the high frequency range and the picture deterioration for the human eyes can be decreased. The transmission order in the third example may be applied to the first example of the transmission unit.

Figure 18:
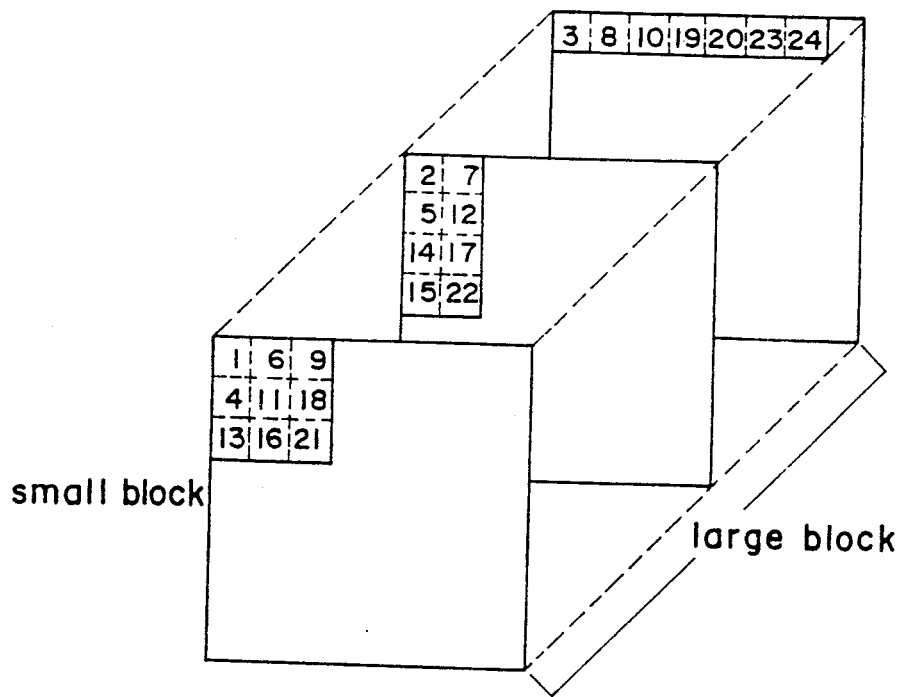
FIG. 18 is a schematic diagram showing an example of the order of data transmission in which the third example of the order of the data transmission is applied to the first example of the transmission unit.

FIG. 18 shows an example in which the third example of the transmission order is applied in the first example of the transmission unit. In FIG. 18 data transmission is made from the low frequency range in the large block basis, with only the components surrounded by the rectangular shape in the transmission range. In this case it is possible to transmit the transmission range separately; therefore, it is not necessary to attach the end signal.

In the practical use various transmission orders are possible other than the transmission orders shown in FIGS. 15 and 17. In case a 3 dimension orthogonal transformation is used, the transmission order may be changed for the 3 dimension.

Figure 19:
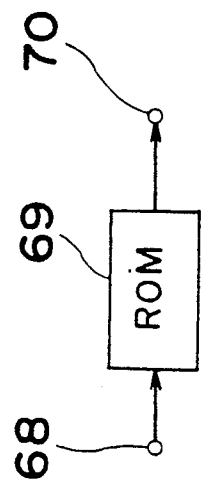
FIG. 19 is a block diagram showing an example of the variable length coding unit.

Next, the variable length coding according to the present invention is explained. In FIG. 19 showing the example of the variable length coding unit, element 68 is an input terminal; element 69 is a ROM (read only memory), and element 70 is an output terminal. The quantized values inputted from the input terminal 68 are converted to the variable length codes in the ROM 69 and outputted to the output terminal 70. An example of the variable length codes is explained hereinafter.

In the first example of variable length codes, a code such as the code length is 1 bit for the quantized value 0 is used. Namely, the code length Mi for the quantized value Ri is expressed as follows:

For $Ri=0$, $Ni=1$.

To use the variable length codes as mentioned above facilitates the estimation of the data value as explained later.

Table 2 shows the second example of the variable length coding. In the table 2, X is an assigned binary value of 1 bit. In the second example of variable length codes, the code length Ni for the number of figures Ki of the absolute value of the quantized value is expressed as follows:

$Ni = 2 \times Ki + 1.$

In this case, the code length can be calculated easily.
In the variable length codes in the table 2, the portion ±128–255 may be changed to 11111111XXXXXXXX.

TABLE 2

| quantized value | variable length code |
| --- | --- |
| 0 | 0 |
| 1 | 10X |
| ±2–3 | 110XX |
| ±4–7 | 1110XXX |
| ±8–15 | 11110XXXX |
| ±16–31 | 111110XXXXX |
| ±32–63 | 1111110XXXXXX |
| ±64–127 | 11111110XXXXXXX |
| ±128–255 | 111111110XXXXXXXX |

An example of code assignment is explained with reference to table 3. The input quantized values are expressed in binary form as:

(S, X7, X6, X5, X4, X3, X2, X1, X0).

wherein S is a bit for the sign of plus and minus and X7 to X0 represent binary value of the absolute value of the quantized values. X7 is the most significant position and X0 is the least significant position. The quantized values represented by 9 bits are encoded by the variable length code according to the rule shown in table 3. However, in the present example, it can be encoded into the variable length code without any complicated calculation. Therefore, it is possible to encode without the ROM shown in FIG. 19.

TABLE 3

| quantized value | variable length code word |
|---|---|
| X0 ... X7 = 0 | 0 |
| X0 = 1, X1 = ... X7 = 0 | 10S |
| X1 = 1, X2 = ... X7 = 0 | 110X0S |
| X2 = 1, X3 = ... X7 = 0 | 1110X0X1S |
| X3 = 1, X4 = ... X7 = 0 | 11110X0X1X2S |
| X4 = 1, X5 = ... X7 = 0 | 111110X0X1X2X3S |
| X5 = 1, X5 = ... X7 = 0 | 1111110X0X1X2X3X4S |
| X6 = 1, X7 = 0 | 11111110X0X1X2X3X4X5S |
| X7 = 1. | 11111111SX0X1X2X3X4X5X6. |

TABLE 4

| quantized value | variable length code |
|---|---|
| 1 | 100X |
| ±2-5 | 101XXX |
| ±6-21 | 110XXXX |
| ±22-53 | 1110XXXXX |
| ±54-181 | 1111XXXXXXXX. |

In the examples, it is possible to estimate the code length by only the front half of the code word. By using the variable length codes mentioned above, it is noted that the word synchronization can be maintained so long as no error occurs at the front half of the code words representing the code length even if errors occur in the transmission path. Moreover, when decoding, the length of the code can be easily detected, and thus, decoding can be effected with a relatively simple circuit arrangement.

Figure 20:
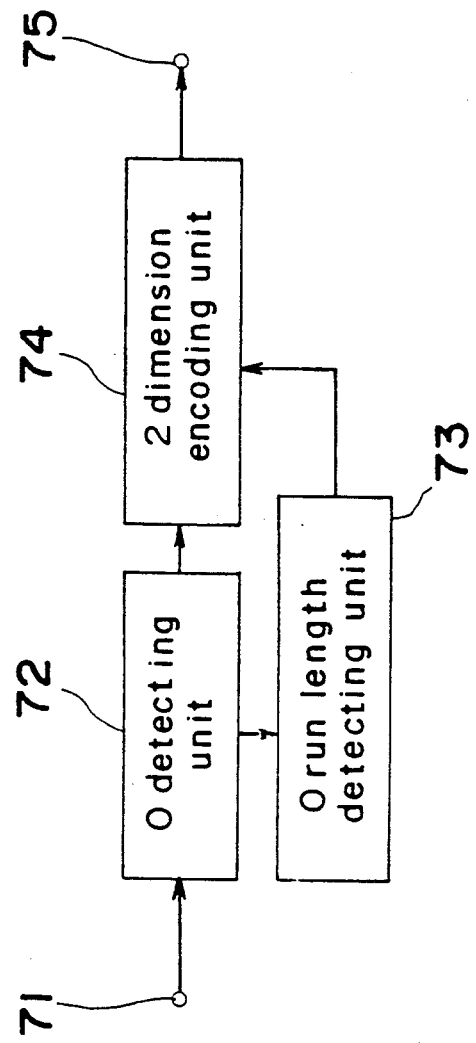
FIG. 20 is a block diagram showing a fourth example of the variable length coding unit.

The fourth example of the variable length coding unit is explained as follows. Almost all of the components of the orthogonally transformed components are 0; therefore, the probability of consecutive generation of 0s of the quantized values is high. To encode the length of the consecutive 0s of the quantized values into the run length code enables one to compress the data amount. To encode the length of the consecutive 0s of the quantized values and the non-0 quantized value appearing first after the consecutive 0s in a code word enables one to compress the data amount. This coding method is referred to as 2 dimension encoding hereinafter. The fourth example is explained with reference to FIG. 20. Element 71 is an input terminal; element 72 is a detecting unit; element 73 is a 0 run length detecting unit; element 74 is a 2 dimension encoding unit, and element 75 is an output terminal. The quantized values inputted from the input terminal 71 are subjected to a determination as to whether or not each of the quantized value is 0 in the 0 detecting unit 72. If the quantized value is 0, the run length value summed in the 0 run length detecting unit 73 is increased by 1. When a non-0 quantized value is detected in the 0 detecting unit 72, 2 dimension encoding is performed by the non-0 quantized value thus detected and the 0 run length value in the 2 dimension encoding unit 74, whereby the 2 dimension code is outputted to the output terminal 75, while the run length value summed in the 0 run length detecting unit 73 is reset. By this method in case where the generation probability of 0 is high, the data amount can be efficiently compressed. When the code word is rearranged in the large block basis and transmitted, it is estimated that the run length of 0 is increased, so that the data compression can be made more efficiently.

Next, the data amount estimating unit is explained.

Figure 21:
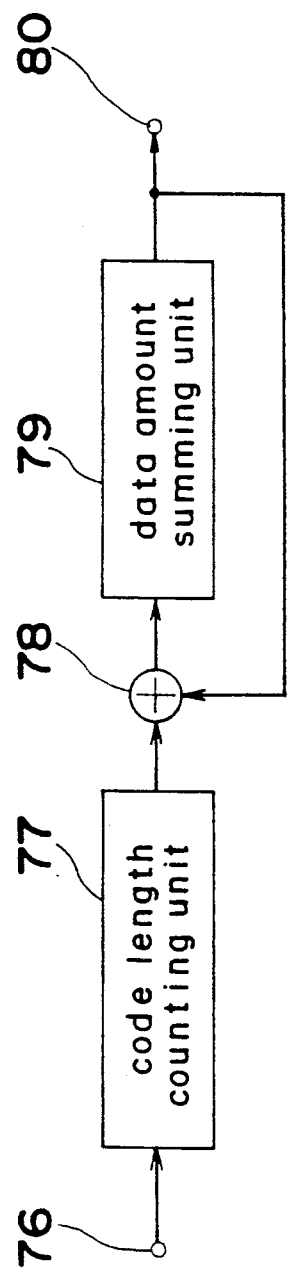
FIGS. 21 to 23 are block diagrams showing first to third examples of a data estimating unit.

Referring to FIG. 21, element 76 is an input terminal; element 77 is a code length counting unit; element 78 is an adder; element 79 is a data amount summing unit, and element 80 is an output terminal. The example shown in FIG. 21 is a circuit for one of the quantized units. The orthogonally transformed component inputted from the input terminal 76 is applied to the code length counting unit 77 in which the code length of the quantized value when the quantized value is converted to the variable length code is calculated. The code length obtained in the code length counting unit 77 is added to the data amount sum before the quantization of the quantized value in the adder 78 and again the added data is inputted to the data amount summing unit 79. In this manner as mentioned above, when the data amount of one small block is calculated, the total value is outputted to the output terminal 80 from the data amount counting unit 79. The code length counting unit 77 may be composed by a ROM simply. It is noted that in order to improve the data compression efficiency, not all of the signals are transmitted by the transmission unit according to the present invention. For this purpose it is necessary to detect the signals to be transmitted and to count the data amount of the data to be transmitted.

Figure 22:
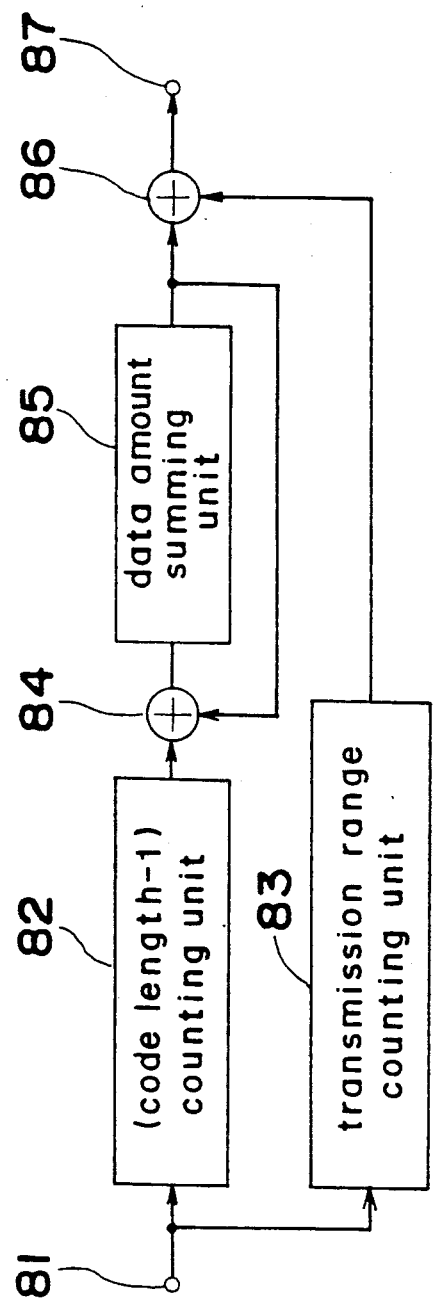

A second example of the data amount estimating unit is explained with reference to FIG. 22. In this example, detection of the signal to be transmitted and counting of the data amount are performed simultaneously. Referring to FIG. 22, element 81 is an input terminal; element 82 is a (code length −1) counting unit; element 83 is a transmission range counting unit; element 84 is an adder; element 85 is a data amount summing unit; element 86 is an adder, and element 87 is an output terminal. The orthogonally transformed components are applied to the (code length −1) counting unit 82 and the value of (code length −1) is calculated therein. The output of the (code length −1) counting unit 82 is added to the data amount of the (code length −1) of the previous (code length −1) data amount whereby the data amount of the total value is applied again to the data amount summing unit 85. Simultaneously in the transmission range counting unit 83, the code word number of the code words to be transmitted is counted and the counted value is added to the sum of the (code length −1) outputted from the data amount summing unit 85 in the adder 86, and further outputted to the output terminal 87. The first variable length coding unit makes code length equal to 1 for the 0 quantized value; therefore, the value of the (code length −1) is 0. Accordingly, the sum of the (code length −1) for the all input signals and the code words to be transmitted is equal to the sum of the code length of the signal to be transmitted. Therefore, the calculation of the data amount and the calculation of the transmission range can be made simultaneously; it thus becomes possible to decrease the time of the data amount estimation to half of the time necessary in the first example of the data amount estimating unit.

Figure 23:
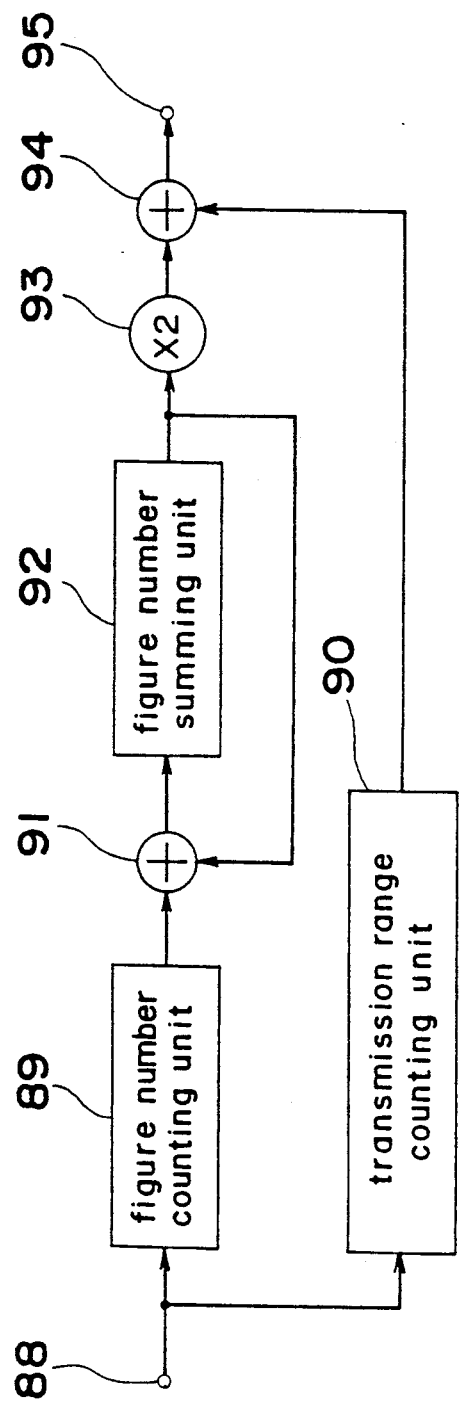

FIG. 23 shows a third example of the data amount estimating unit which is applied to the arrangement using the second example of the variable length coding unit. In FIG. 23, element 88 is an input terminal; 89 is a figure number counting unit; element 90 is a transmission range counting unit; element 91 is an adder; element 92 is a figure number summing unit; element 93 is a multiplier; element 94 is an adder, and element 95 is an output terminal. The figure number counting unit 89 calculates the figure number of the absolute value of the quantized value of the orthogonally transformed components applied to the input terminal 88. The output of the figure number counting unit 89 is added in the adder 91 to the total value of the respective figure numbers that has been summed for the previous signals before the present signal outputted from the figure number summing unit 92 and the summed value is inputted again to the figure number summing unit 92; simultaneously, in the transmission range counting unit 90, the number of the coded words to be transmitted is calculated and the calculated number is added to the number which is multiplied twice in the multiplier 93 and outputted to the output terminal 95. In the second example of the valuable length coding unit, the code length is expressed by twice the figure number of the quantized value +1; therefore, the data amount can be estimated easily.

Figure 24:
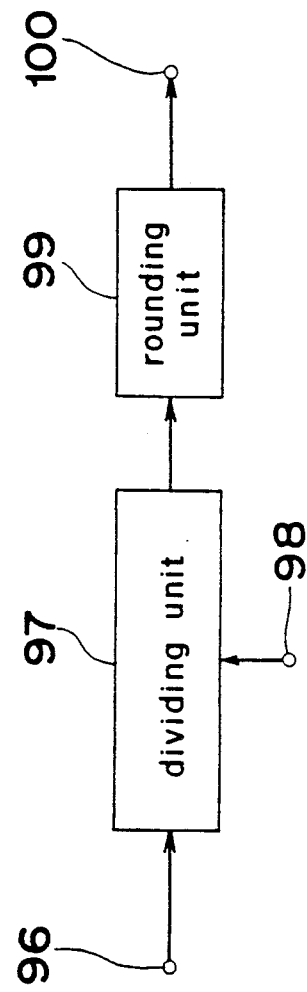
FIGS. 24 to 27 are respectively block diagrams showing first to fourth examples of a quantizing unit.

An example of the quantizing unit used in the present invention is explained hereinafter. In FIG. 24; element 96 is an input terminal; element 97 is a dividing unit; element 98 is a quantizing range input terminal; element 99 is a rounding unit, and element 100 is an output terminal. The signals inputted from the input terminal 96 are divided in the dividing unit 97 by the quantizing range value applied to the quantizing range input terminal 98 and the output of the dividing unit 97 is rounded by the rounding unit 98 and is outputted to the output terminal 100.

The arrangement in the example is equivalent to such a device having the same number of different quantizers as the number of kinds of quantization ranges. When the quantization range is small, the quantized value after the quantization is small and when the quantization range is large, the quantized value after the quantization is large; therefore, to select the quantization range enables one to vary the data amount after the quantization. The dividing unit 97 in FIG. 24 may be replace by a ROM. When a ROM is used, the same operation may be performed by inputting the number representing the quantization range.

Figure 25:
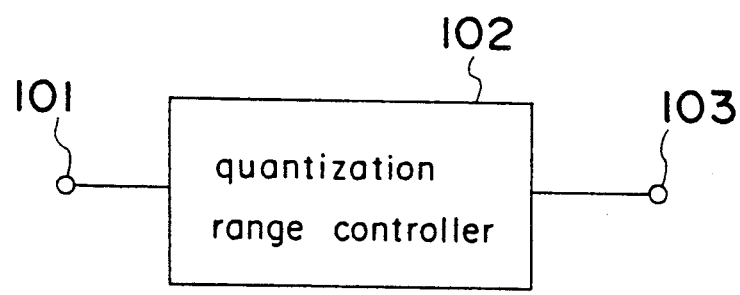

The second example of the quantizing unit is so arranged that a large quantization range is assigned for the low frequency components of the DCT transformed components and a small quantization range is assigned for the high frequency components of the DCT transformed components. FIG. 25 shows the second example of the quantization unit. In FIG. 25, element 101 is an input terminal; element 102 is a quantization range controller, and element 103 is an output terminal. The order of the input signals which is now being quantized is inputted to the quantization controller 102 from the input terminal 101. The quantization range controller 102 detects the frequency of the orthogonal components by the order of the input signal. In a case where the input signal is the high frequency component, the quantization range is made large and in a case where the input signal is the low frequency component, the quantization range is made small. the quantized values are outputted to the output terminal 103.

By this arrangement, since it becomes possible to concentrate the quantization distortion in the high frequency range of the orthogonal components, the visual picture quality and the block distortion due to the orthogonal transformation can be improved. Applying the second example of the quantization to the first example of the quantization, by making the difference of the quantization range in the low frequency range and the quantization range in the high frequency range in the quantizer having the larger quantization range, it is possible to make the data compression with a higher efficiency.

Figure 26:
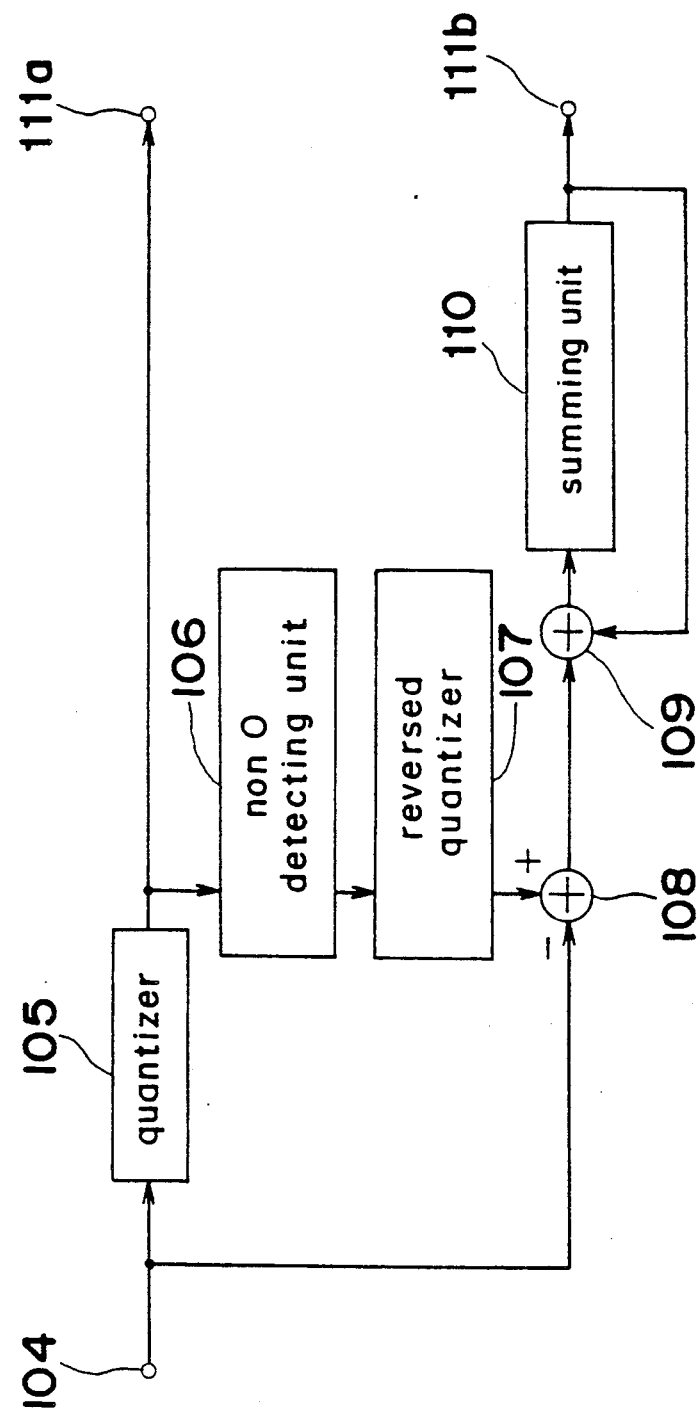

FIG. 26 shows a third example of the quantizing unit. In FIG. 26, element 104 is an input terminal; element 105 is a quantizer; element 106 is a non-0 (zero) detecting unit; element 107 is a reversed quantizer; element 108 is a subtracter; element 109 is an adder; element 110 is a summing unit for summing the error of the quantization and elements 111a and 111b are output terminals. Signals fed from the input terminal 104 are quantized in the quantizer 105 and are outputted from the output terminal 111a. On the other hand, the outputs of the quantizer 105 are fed to the non-0 detecting unit 106 in which it is determined whether or not the output is 0. If the output is not 0, the non-0 output is fed to the reversed quantizer 107 in which the quantized value is reversed to its original form. The reversed value outputted from the reversed quantizer 107 is subtracted by the value of the present input signal in the subtracter 108 and the quantization error is calculated. The quantization error of the present input signal is summed, in the adder 109, to the total value of the previous quantization errors of the input signals that have been supplied before the present input signal. The total quantization error (to which the quatization error is already added in the adder 109) is again applied to the summing unit 110. In such a manner the total quantization errors of one small block are summed and outputted from the output terminal 111b. In the present example of the quantization, an average value of the quantization error of non-0 quantized values of every small block is calculated and is outputted with the quantized value. The quantization errors in the orthogonal transformation are often uneven in the small block basis. Therefore, to calculate the quantization errors for every block and to use the data of the quantization error to correct the decoded values at the time of the decoding enables to improve the quantization distortion. The signals representing the quantization error for the small block transmitted at this time can be represented by a few bits, and the increment of the data amount is very small.

Figure 27:
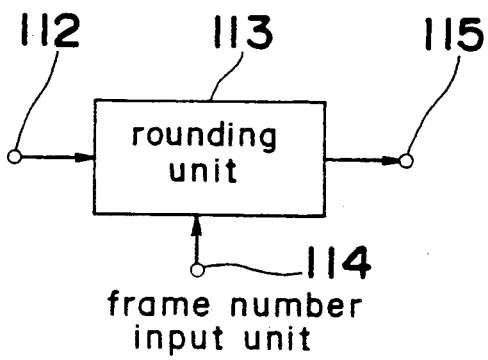

In a fourth example of the quantizing unit, signals situated on the same positions in the frame direction or field direction are quantized by separate quantizers of different quantizing property for every frame or every field. This can be realized by controlling the rounding unit 99 shown in FIG. 24. The arrangement of the fourth example is shown in FIG. 27. In FIG. 27, element 112 is an input terminal; element 113 is a rounding unit; element 114 is a frame number input unit, and element 115 is an output terminal. The signals divided by the quantization range and inputted from the input terminal 112 are rounded in the rounding unit 113 according to the frame number inputted from the frame number input terminal 114 and are outputted to the output terminal 115. In the example, the way of rounding is varied every consecutive frames. Using the fact that the difference quantized values are transmitted for the same orthogonal components in the field basis or frame basis, the quantization error can be cancelled at the time of decoding. Therefore, in a moving picture whose motion is small, it is possible to decrease the quantization error. In addition, due to the fact that the quantization error is different field to field or frame to frame, the distortion is scattered time to time thereby decreasing the block distortion. Although the quantization property is varied by varying the way of rounding, there may vary the quantization property by adding different offset values field to field or frame to frame.

Next, the details of the quantizer selecting unit is explained.

Figure 28:
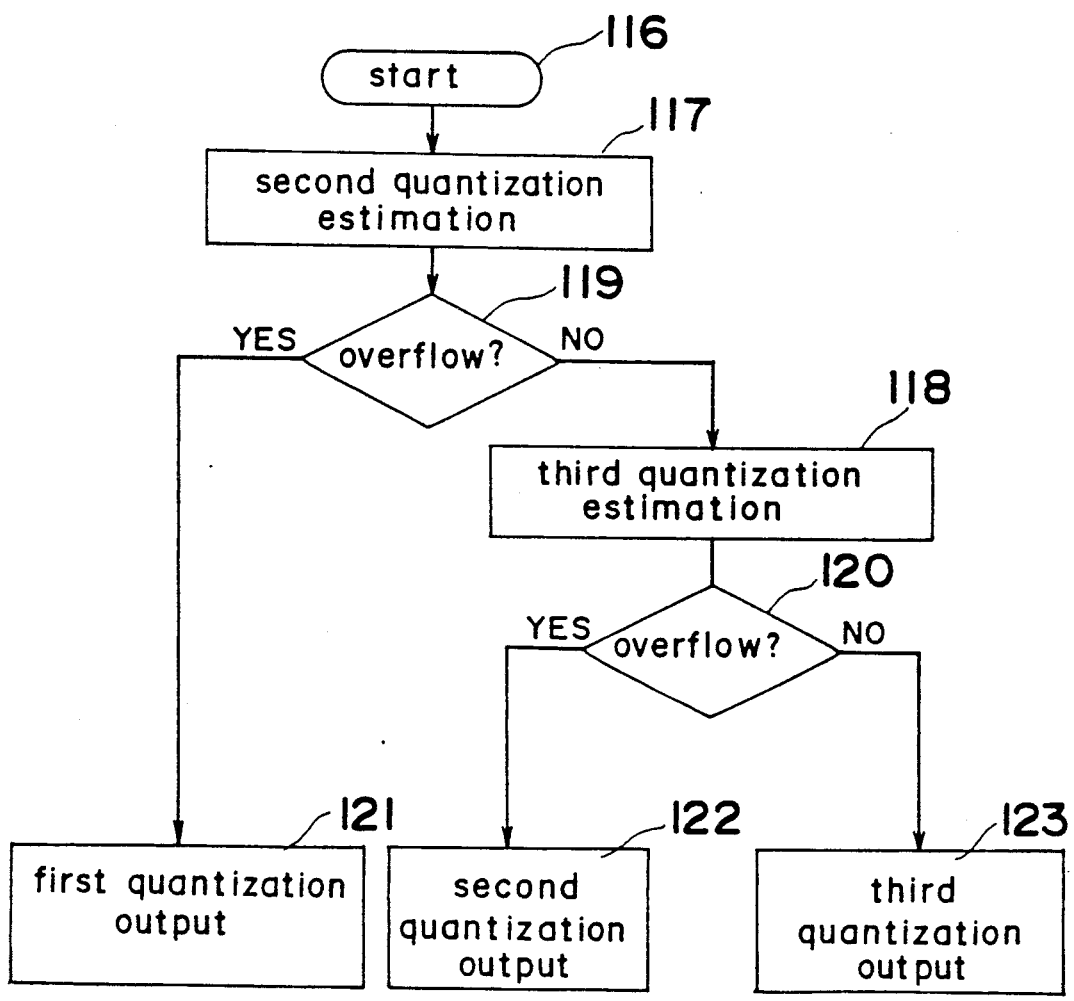
FIGS. 28 and 29 are flowcharts showing first and second examples of the operation of the quantizer selecting unit.

The first example of the quantizer selecting unit operates in such a manner as described hereinafter. Namely, when there are m candidates quantizers, the data amount is estimated for such a case that if quantization is performed using about the m/2 th quantizer. When the estimated data amount is larger than transmittable value, the candidate quantizers are limited to such quantizers that produce a data amount smaller than the data amount produced by the previously selected quantizer. On the contrary, if the estimated data amount is smaller than the transmittable data value, the candidate quantizers are limited to such quantizes which produce a data amount larger than the date amount produced by the previously selected quantizer. In this way, the number of candidate quantizers is decreased by half every estimation and by repeating the above operation, the optimum quantizer can be decided. By this method it is possible to select the optimum quantizers by log n times of data amount estimation when there are n candidate quantizers. An example of process mentioned above is shown in a flowchart of FIG. 28. In FIG. 28, element 116 is a start step; element 117 is a second quantization estimation; element 118 is a third quantization estimation; element 119 and 120 are overflow detections, element 121 is a first quantization output; element 122 is a second quantization output, and element 123 is a third quantization output. In this example three quantizing units are provided, and the larger quantized values are outputted in the order of the third quantization, second quantization and first quantization for the same input value. first, the second quantization estimation is made in the step 117 using the second quantization for the input value. Then the process goes to the step 119 in which a determination is made as to whether or not the data amount obtained in the second quantization step 117 exceeds the transmittable limit. In the case of the amount exceeding the limit, the process goes to the step 121 to select the first quantization and the process goes to the end. In the case of the amount not exceeding the limit, the process goes to the step 118 in which the data amount is estimated using the third quantization and estimation. Then the process goes to the step 120 in which a determination is made as to whether or not the data amount quantized in the third quantization exceeds the transmittable limit. In the case of the amount exceeding the limit, the process goes to the step 122 and the second quantization is selected and the process goes to the end. In the case of the amount not exceeding the limit, the process goes to the step 123 in which the third quantization is performed and the process goes to the end. As mentioned above, in the second example of the quantizer selecting unit, it is possible to decrease greatly the calculation amount for the data amount estimation. Also in the present example, a quantizer which produces the maximum data amount which does not exceed the upper transmittable limit, there may be selected a quantizer which produces the minimum data amount which does not fall below the lower transmittable limit.

In the second example of the quantizer selecting unit, the small blocks contained in one large block is divided in two by the front half and rear half with the boundary of jth small block counted from the front, and two quantizers included in the divided groups which quantizers produce the nearest quantized data amount. In transmitting the quantized data the order number i and j of the used quantizer are coded and transmitted. In the second example, only two kinds of quantizer units are used in one large block. By this limitation, since the number of combinations of quantizers in the large block can be decreased, the calculation amount can be decreased. In addition, the two kinds of quantizers are selected from the groups of the front half and the rear half divided in the large block. Therefore, the information representing what quantizer is used is expressed only by the boundary of the front half and the rear half, that is small j, and thus, the information to be transmitted can be made small.

The second example of the quantizer selecting unit is explained as follows. It is assumed that there are 8 kinds of quantizers and one large block consist of 24 small blocks. It is also assumed that the data amount of the jth small block in the ith quantizer is expressed as $D(i, j)$ and the following $S(i, j)$.

$$S(i, j) = D(i, j) - D(i1, j)$$

(It is assumed that $D(-1, J) = 0$, $D(i-1, j)$)

The above equation is calculated for 24 small blocks to obtain the table 5

TABLE 5

| | 0 | 1 | 2 | ... | j | ... | 23 |
|---|---|---|---|---|---|---|---|
| 0 | S(0,0) | S(0,1) | S(0,2) | ... | S(0,j) | ... | S(0,23) |
| 1 | S(1,0) | S(1,1) | S(1,2) | ... | S(1,j) | ... | S(1,23) |
| i | S(i,0) | S(i,1) | S(i,2) | ... | S(i,j) | ... | S(i,23) |
| 7 | S(7,0) | S(7,1) | S(7,2) | ... | S(7,j) | ... | S(7,23) |

Figure 29:
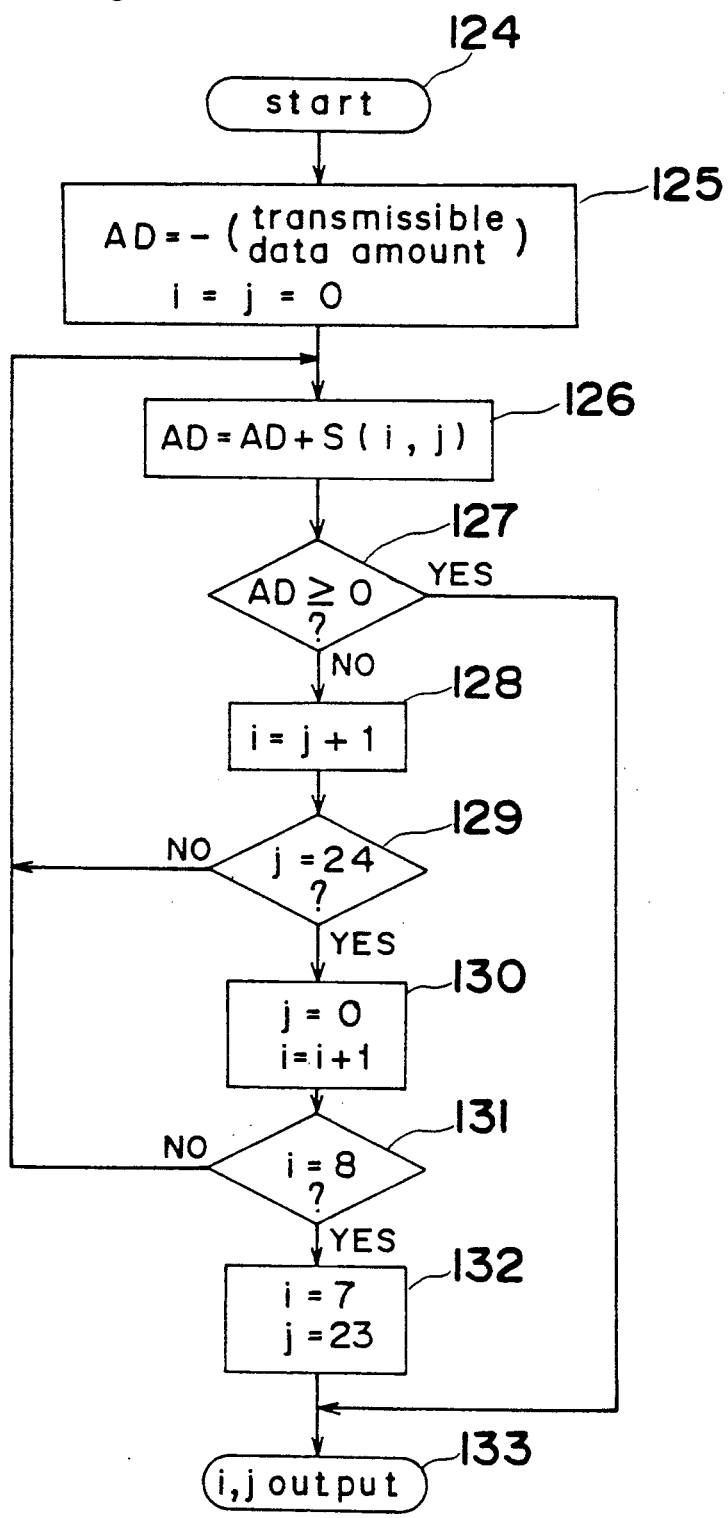

The optimum values i and j are calculated according to the process shown in FIG. 29 using the data shown in the table 5.

First, in step 125 the initial value is set making the data amount total AD = −(transmittable data amount) and i=j=0. In the step 126, the total data amount is calculated by the equation $AD = AD + S(i, j)$. Then the process goes to the step 127 in which a determination is made as to whether or not the value of AD is larger than 0; in case of AD being more than 0, the process goes to the step 133 in which the values i, j are outputted and the process goes to end.

In the case where the value AD is negative, the process goes to the step 128 for calculating j=j+1. The process then goes to the step 129 in which a determination is made as to whether or not the value j is 24; in the case of j not being equal to 24, the process goes to the step 126. In the case of j=24, the process goes to the step 130, wherein i=i+1, j=0 are performed.

In the step 131 a determination is made as to whether or not the value i is 8; in the case of i not being equal to 8, the process goes to the step 126. In the case where the value of i is 8, the process goes to the step 132 for making i=7, j=23 and the values i, j are outputted in the step 133 and the process goes to the end. By this way the values i and j can be calculated. Since the values i and j can be expressed by 3 bits and 5 bits, the information as to what quantizer is used can be transmitted by 8 bits for the large block.

The third example of the quantizer selecting unit is arranged to operate in the following manner.

Namely, for two quantizers having different quantization widths, producing the nearest quantized values when the input signals are quantized, the maximum value of the absolute value of the orthogonal transformed value is detected every small block, and the quantizer whose quantization width is small is used for the small block which produces a relatively large maximum value, while the quantizer whose quantization width is small is used for the small block which produces relatively small maximum quantized value. The quantized values are transmitted with the information representing the quantizers used for quantizing the data of the respective small blocks.

Figure 30:
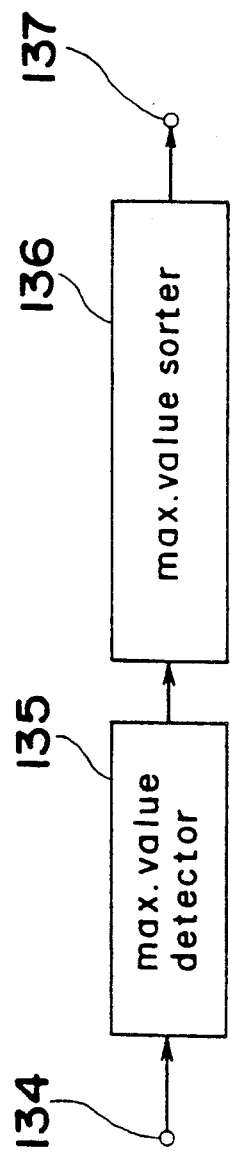
FIGS. 30 and 31 are respectively block diagrams showing third and fourth examples of the quantizer selecting unit.

The way of assigning two quantizers is explained. Referring to FIG. 30; element 134 is an input terminal; element 135 is a max. value detector; element 136 is a max. value sorter, and element 137 is an output terminal. The orthogonal component inputted from the input terminal 134 is applied to the max. value detector in which the maximum value of the orthogonal component is detected every small block. In the max. value sorter 136, the order of the small blocks is calculated so that the maximum values of the respective small blocks are lined up in the order from the larger value to the small value. In this manner, the respective small blocks are arranged in the order of the larger dynamic range. Thus, two quantizers are assigned to the respective small blocks in a similar manner as mentioned in the second example of the quantizer selecting unit.

In general, in a picture having a large dynamic range, it is hard to visually find picture deterioration. On the other hand, it is easy to visually find picture deterioration in a picture having a small dynamic range. Therefore, it is possible to compress the data amount for preventing visual picture deterioration by assigning a quantizer having a large quantization width to the small block having a large maximum value of the absolute quantized value.

Figure 31:
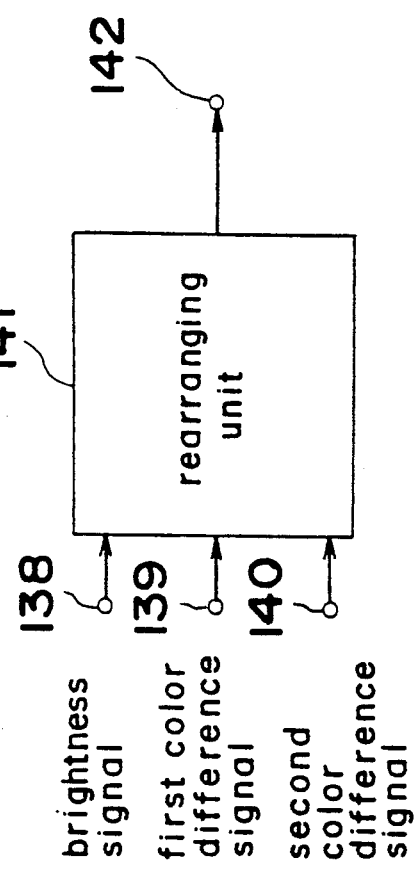

A fourth example of the quantizer selecting unit is arranged to select the quantizers for processing the brightness signals and two color difference signals. Specifically, in the fourth example, the quanitzer selecting unit is arranged to select either a quantizer having a relatively large quantization range for the signals in which it is hard to recognize visual picture deterioration and a quantizer having a relatively small quantization range for the signals in which it is easy to recognize visual picture deterioration. In FIG. 31; element 138 is a brightness signal input terminal; element 139 is a first color difference signal input terminal; element 140 is a second color difference signal input terminal; element 141 is a re-arranging unit, and element 142 is an output terminal. the respective orthogonal transformed components of the brightness signals, the first color difference signals and the second color difference signals inputted form the respective input terminals 138, 139 and 140 have their signal order re-arranged in the re-arranging unit 141 in such a order that the visual recognition of the picture deterioration is easier. For example, assuming that it is easy to visually detect or recognize the picture deterioration in order of the brightness signal, the first color difference signal and the second color difference signal, the input signals are re-arranged in the order as described above. The actual re-arranging operation can be performed in the above large block generating unit. The re-arranged small blocks enable one to select the quantizers in the same operation as described in the second example of the quantizer selecting unit.

Figure 32:
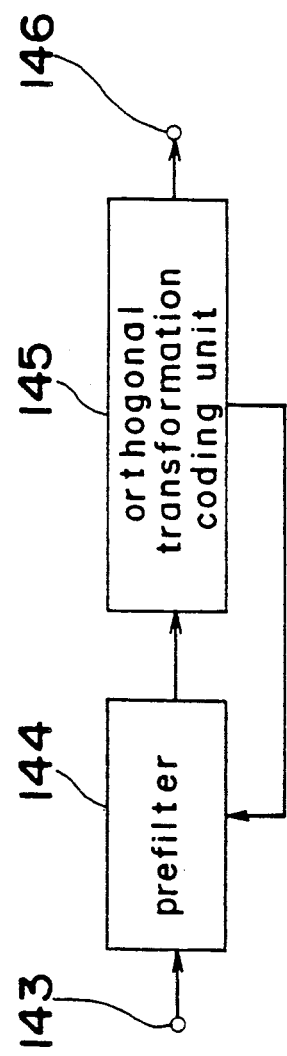
FIG. 32 is a block diagram showing an example of the coding unit used in another embodiment of the present invention.

Another embodiment of the present invention is described hereinafter. FIG. 32 is a block diagram of a coding unit according to the present invention, in which element 143 is an orthogonal transformation coding unit, and element 146 is an output terminal. In the embodiment shown in FIG. 32, the frequency range of the input signals is limited by the prefilter 144. The signals whose frequency is limited are coded by the orthogonal transformation coding unit and are outputted to the output terminal 146. By limiting the frequency range by the prefilter 144, it becomes possible to reduce the picture deterioration such as the block distortion due the data compression.

Figure 33:
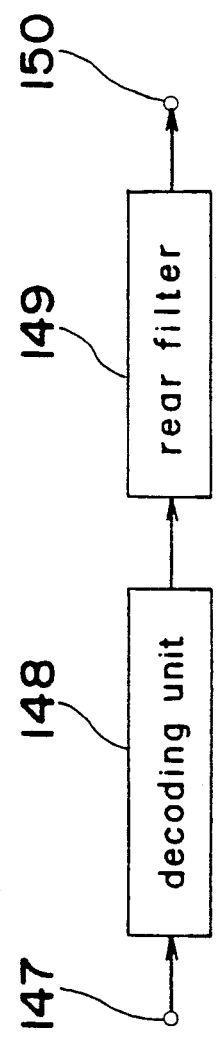
FIG. 33 is a block diagram showing an example of decoding unit.

FIG. 33 is a block diagram of the decoding unit of the present invention in which element 147 is an input terminal; element 148 is a decoding unit for decoding the signals outputted from the orthogonal transformed coding device of the present invention; element 149 is a rear filter, and element 150 is an output terminal. In the device shown in FIG. 33, the coded words inputted from the input terminal 147 are decoded by the orthogonal transformed decoding unit 148. The decoded signals are outputted to the output terminal 150 through the rear filter 149 in which the frequency range of the decoded signals are limited. By limiting the frequency range of the decoded signals as mentioned above, it becomes possible to reduce picture deterioration such as block distortion due to the data compression. In the case where the prefilter is used at the time of coding, the limited range cut at the time of coding can be reproduced by the rear filter having an inverted band pass property of the prefilter.

The details of the prefilter is explained. A first example of the prefilter depress the high frequency components of the vertical, horizontal or skew components. In the transmission unit as described above, if the quantized values representing the high frequency components of the vertical, horizontal skew components become 0, the data amount can be greatly compressed. Since the distortion of the high frequency range signals are hard to recognize visually, by using the prefilter mentioned above, it is possible to decrease the data amount, thereby preventing the picture deterioration.

A second example of the prefilter operates to divide the input signals four ranges of low range of horizontal and vertical components, horizontal for the high range and vertical for the low range, horizontal for the low range and vertical for the high range and horizontal and vertical for the high frequency and data amounts in the respective ranges are compressed independently and the compressed data of the respective ranges are added. The second example of the prefilter is explained with reference to FIG. 34, in which element 151 is an input terminal of the prefilter; element 152 is a low pass filter for the vertical component (referred to as LPF hereinafter); elements 153 and 154 are LPFs for horizontal components. Elements 156, 157 and 158 are subtracters; elements 159, 160, and 161 are data compressors; element 162 is an adder and element 163 is an output terminal.

Figure 34:
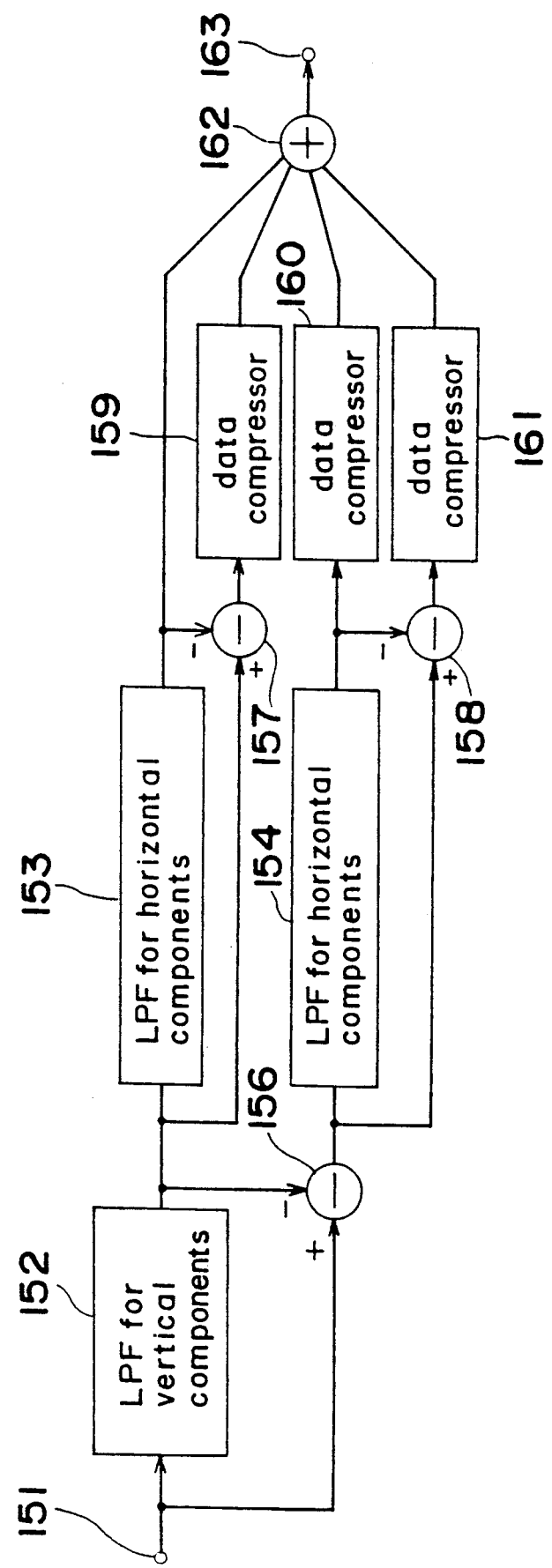
FIG. 34 is a block diagram of a second example of a prefilter.
Figure 35:
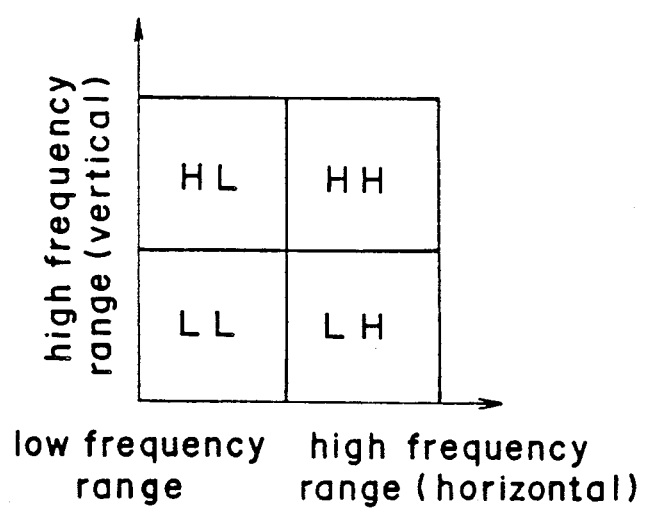
FIG. 35 is a schematic diagram showing a manner of divide the signals into four regions by the filter used in the embodiment shown in FIG. 32.

The signals inputted from the input terminal 151 are converted to the low frequency component by the vertical LPF 152 and its output is subtracted from the input signals in the subtracter 156, whereby the output of the vertical LPF 153 represent the low frequency component in the vertical direction of the input signals and the output of the subtracter 156 represents the high frequency components in the vertical direction of the input signals. Using the horizontal LPFs 154 and 155 and the subtracter 157, the two signals mentioned above can be divided further in the horizontal direction. FIG. 35 shows the two dimension frequency range dividing method. The output of the horizontal LPF 154 in FIG. 34 is shown by the area LL in FIG. 35; the output of the subtracter 157 in FIG. 34 is shown by the area LH in FIG. 35; the output of the horizontal LPF 155 in FIG. 34 is shown by the ara HL and the output of the subtracter 158 in FIG. 34 is shown by the area HH in FIG. 35. The four ranges divided on the two dimensional plane except for the component LL are compressed in the data compressors 159, 160 and 191. The respective compressed components are added in the adder 162, and restored to one signal and outputted from the output terminal 43. To divide the signals into regions on the two dimensional region and to compress the data amount, the data compression can be made to efficiently match with the human eyes property. Specifically, by compressing greatly the data in the area HH where the picture deterioration is hard to recognize, the data amount can be efficiently decreased.

The third example of the prefilter performs non-linear compression in the respective areas in the second prefilter. The human eyesight is not sensitive to amplitude distortion of the high frequency range. Therefore, the greater the amplitude of the component, the larger the compression. In this manner it is possible to concentrate the distortion to the components having the greater amplitude in the high frequency components.

The fourth example of the prefilter is provided with a suitable threshold value in the respective divided ranges and the signal smaller than the threshold values are rounded. According to a human's eyesight, since the small amplitude signals in the high frequency range are recognized as noise, such small components can be neglected. By eliminating such small components which are smaller than the threshold value, the amount of unnecessary information can be decreased.

The fifth example of the prefilter is adapted to control the frequency property of the prefilter in response to the quantized information of the orthogonal transformed components. The fact that a quantizer of a large quantizing range is selected at the time of orthogonal transformed coding shows that the amount of the input information is large and the distortion due to the data compression is large. On the contrary, the fact that a quantizer of a small quantizing range is selected shows that the input information is small and distortion due to the data compression is small. Therefore, if the selected quantization range in the past is large, the limitation by the prefilter is enhanced to decrease the frequency limitation. If the selected quantization range in the past is small, the limitation by the prefilter is reduced to decrease the distortion by the prefilter, whereby for the picture having a small information amount, the picture information is coded with higher fidelity and for the picture with greater amount of the information, the data amount can be compressed, thereby preventing the visual picture quality deterioration.

The details of the rear filter are explained. A first example of the rear filter compresses or expands the high frequency components in the horizontal direction, vertical direction or skew direction of the input signals. In the orthogonal transformation coding, the effect of the quantization appears as the block distortion between the small blocks. It is possible to decrease the block distortion by compressing the high frequency components in the boundary between the small blocks by the rear filter. In case where the frequency range is limited by the prefilter at the time of coding, it is possible to reproduce the limited range by expanding the high frequency components by the rear filter.

A second example of the rear filter filters using the signals between the consecutive frames or consecutive fields, whereby it is possible to construct the filter suppressing the differential signals between the frames or fields. By this arrangement, it is possible to decrease distortion due to the data compression in the small motion picture.

A third example of the rear filter divides the input signals into four regions consisting of a low frequency range for the horizontal component and vertical component, a high frequency region for the horizontal component and low frequency region for the vertical component, a low frequency region for the horizontal component and high frequency region for both the horizontal component and vertical component, whereby the respective signals in the four regions are independently linearly data compressed and expanded and the signals in all of the regions are added. The arrangement to perform such operation is formed in such an arrangement as shown in FIG. 34. By the arrangement mentioned above, it is possible to eliminate the distortion due to the data compression matching with the human's eye property. If the second example of the prefilter is used, it is possible to reproduce the picture signals contained in the limited frequency range by using the rear filter of inverted property of the prefilter.

A fifth example of the rear filter is arranged to use non-linear expansion to expand the respective four ranges in the third example of the rear filter. If the high frequency range is linearly expanded as made in the third example, the block distortion may be expanded. To prevent the drawback, the non-linear expansion is employed so that the small high frequency component is not expanded but only the large high frequency component is expanded. In general, since the amplitude component of the block distortion is small, it becomes possible to reproduce the signals without amplifying the block distortion.

A fifth example of the rear filter is provided with a threshold value after the frequency division in the second, third or fourth examples and the values smaller than the threshold value are rounded to 0. In the human eye property, the small high frequency components are recognized as noise, and the effect of the elimination of such small high frequency component is small, even if such components are eliminated. To eliminate the component smaller than the threshold value enables one to decrease the amount of the unnecessary information. Also the block distortion can be eliminated.

A sixth example of the rear filter controls the frequency property of the rear filter in response to the quantization information of the transmitted data. When a quantizer of a large quantization range is used at the time of quantization and coding, this means that the distortion due to the data compression is large. Therefore, to enhance the frequency range limitation enables one to decrease the effect of the quantization distortion. On the contrary, when the quantizer of a small quantization range is used, this means that the distortion due to the data compression is small. Therefore, to decrease the frequency range limitation of the rear filter enables one to decrease the distortion by the rear filter. If the fifth example of the prefilter is used at the coding, it is possible to estimate the prefilter in use by the selected quantizer. Therefore, it is possible to reproduce the limited frequency component by using the rear filter having the reversed property of the prefilter used.

What is claimed is:

1. An orthogonal transform coding device which comprises: a large block generating means for assembling sample values of input signals to form a large block of the sampled input signals; a small block generating means for dividing said large block formed in said large block generating means into a plurality of small blocks; an orthogonal transform means for orthogonally transforming the signals in each small block; a first quantizing means having a plurality of kinds of quantizers each of which quantizes the orthogonally transformed components provided in said transforming means; a data amount estimating means for calculating an amount of data obtained after the quantizing is effected in said first quantizing means; a selection means for selecting an optimum quantizer in said quantizing means for every small block corresponding to the result of the calculation of the data amount of every small block by the data amount calculating means; a second quantizing means for quantizing the orthogonally transformed component in said large block; a coding means for converting the quantized value obtained in said second quantizing means into variable length coded data; and a transmission means for transmitting said variable length coded data with the information of said selected quantizer.

2. The orthogonal transform coding device according to claim 1, wherein said large block generating means provides a large block of television signals within one field.

3. The orthogonal transform coding device according to claim 1, wherein said large block generating means provide a large block of a plurality of consecutive fields of television signals.

4. The orthogonal transform coding device according to claim 1, wherein said large block generating means provides a large block of signals of picture elements juxtaposed in one picture.

5. The orthogonal transform coding device according to claim 1, wherein said large block generating means provide a large block by assembling a plurality of small blocks situated in various portions in one picture of a television signal.

6. The orthogonal transform coding device according to claim 1, wherein said large block generating means provides large blocks in such a manner that when said input signals comprise television signals which are composed of brightness signals and color difference signals, all of the large blocks include said brightness signals and color difference signals or R,G and B signals in substantially equal ratios.

7. The orthogonal transform coding device according to claim 1, wherein said small block generating means provides a small block composed of signals included in only one field of television signals.

8. The orthogonal transform coding device according to claim 1, wherein said small block generating means provides a small block composed of signals of a plurality of fields of television signals.

9. The orthogonal transform coding device according to claim 1, wherein said small block generating means provides a small block composed of signals in one field or one frame or a consecutive plurality of fields of television signals.

10. The orthogonal transform coding device according to claim 1, wherein said orthogonal transform means transforms data contained within the signals in each small block in terms of three dimensions including a horizontal direction, a vertical direction and time.

11. The orthogonal transform coding device according to claim 1, wherein said transmission means rearranges the quantized values of a small block in a transmission region made by a matrix having its origin defined by the values of the lowest frequency components with the order from the low frequency value to the high frequency value in both horizontal and vertical directions so as to include all of non-zero values and transmits coded words of the quantized values included only in the transmission region and information of the transmission region.

12. The orthogonal transform coding device according to claim 1, wherein said transmission means rearranges the quantized values of a small block in a transmission region made by a matrix having its origin defined by the values of the lowest frequency components with the order from the low frequency value to the high frequency value in both horizontal and vertical directions so as to include all of the non-zero values and transmits coded words of the quantized values included in the transmission region from the quantized value representing the lowest frequency component up to the quantized value representing the highest frequency component in the order from the coded word of the lowest frequency component and transmits end signal or information representing the position of the final coded word in place of transmitting the coded words after the highest non-zero frequency component has been transmitted.

13. The orthogonal transform coding device according to claims 11 or 12, wherein, in a case where n small blocks are included in the large block, the transmission means transmits the coded words from the coded word representing the lowest frequency component by the large block basis in such a manner as:

--- the first coded word in the first small block
the first coded word in the second small block

.

the first coded word in the nth small block
the second coded word in the first small block

.

the nth coded word in the nth small block.

---

14. The orthogonal transform coding device according to claim 1, wherein the variable length coding means encodes the quantized value with the length 1 for the quantized value 0.

15. The orthogonal transform coding device according to claim 1, wherein the variable length coding means encodes the quantized value with the length 2K+1 or 2K for the number of figure K of the absolute value of the quantized value.

16. The orthogonal transform coding device according to claim 1, wherein the variable length coding means encodes in such a manner that front half of the coded word represents the coded length.

17. The orthogonal transform coding device according to claim 1, wherein the variable length coding means encodes the quantized values in the order defined by the data transmission means in such a manner that the number of zero quantized values and non zero quantized values appearing first are expressed by one coded word.

18. The orthogonal transform coding device according to claim 1, wherein the data amount estimating means calculate the data amount of the coded data by adding the code lengths of the coded data to be transmitted by the transmission means.

19. The orthogonal transform coding device according to claim 14, wherein the data amount estimating means calculates the data amount according to the following equation:

$$\Sigma(N_i-1)+M$$

wherein
$N_i$ is code length of the ith encoder
$M$ is number of the quantized values to be transmitted.

20. The orthogonal transform coding device according to claim 15, wherein the data amount estimating means calculates the according to the following equation $2 \times \Sigma K_i + M$
wherein $K_i$ is the number of figures of the absolute value of the quantized values of the quantizer and
$M$ is number of the quantized values to be transmitted.

21. The orthogonal transform coding device according to claim 1, wherein the quantizing means comprises a plurality of quantizers each having a different quantization range.

22. The orthogonal transform coding device according to claim 21, wherein the quantizers for the high frequency orthogonal transformed component are within a first quantization range and the quantizers for the low frequency orthogonal transformed components are within a second quantization range which is narrower than said first quantization range.

23. The orthogonal transform coding device according to claim 21, wherein the quantizing means transmits average of the quantizing errors of the quantized values except for 0 every small block at the time of quantization and at the time of decoding, the reversed quantized values are corrected by the average value of the quantization errors.

24. The orthogonal transform coding device according to claim 21, wherein the quantizing means quantizes the signals on the same position on the picture plane of the fields or frame with quantizers of different quantization ranges.

25. The orthogonal transform coding device according to claim 1, wherein the quantizer selecting means performs the steps of:
wherein when the estimated quantized data amount is larger than the transmissible data amount, selecting only the quantizers producing the data amount smaller than the data amount produced by the quantizer which has been subjected to the data estimation, and wherein when the estimated quantized data amount is smaller than the transmissible data amount, selecting only the quantizers producing the data amount larger than the data amount produced by the quantizer which has been subjected to the data estimation;
wherein the number of candidate quantizers are decreased by half and the above mentioned process is repeated so as to select the optimum quantizer.

26. The orthogonal tranform coding device according to claim 1, wherein the quantizer selecting means performs the steps of:
dividing the small blocks included in a large block into a front half including quantizers from the leading one to a jth one and a rear half;
selecting one quantizer from the front half and rear half, which quantizers produces the nearest quantized values;
transmitting the quantized value and information representing the quantizers and the number j.

27. The orthogonal transform coding device according to claim 1, wherein the quantizer selecting means performs the steps of:
detecting the maximum values of the absolute value of the orthogonal transformed value in every small blocks;
selecting a quantizer of a first quantization width for the small block having large maximum quantized value and a quantizer of a second quantization width which is smaller than said first quantization width for the block having a small maximum quantization value;
transmitting the coded data representing one of the quantizers used and information representing what quantizer each small block uses.

28. The orthogonal transform coding device according to claim 1, wherein, for the brightness signals and two color difference signals, the quantizer selecting means selects a quantizer having a first quantization width for the signals in which it is hard to recognize visual picture deterioration and selects a quantizer having a second quantization width which is smaller than said first quantization width for the signals in which it is easy to recognize visual picture deterioration.

29. The orthogonal transform coding device according to claim 1, wherein the device further comprises at least one of a prefilter disposed before the large block generating means and a rear filter disposed for the reproduced output at the time of decoding.

30. The orthogonal transform coding device according to claim 29, wherein the prefilter and the rear filter compresses or expands the vertical components, horizontal components or skew components of the signal.

31. The orthogonal transform coding device according to claim 29, wherein the prefilter or rear filter divides the signals into four regions consisting of low frequency regions in the horizontal direction and vertical direction, a low frequency region in the horizontal direction and a high frequency region in the vertical direction, a high frequency region in the horizontal direction and a low frequency region in the vertical direction and high frequency regions in both horizontal and vertical directions, and compress or expand the respective regions, and add the respective regions.

32. The orthogonal transform coding device according to claim 31, the prefilter and the rear filter are provided with threshold values after dividing the signals into the four regions, and rounding the signals to 0 if the output value of each region is smaller than the threshold value.

33. The orthogonal transform coding device according to claim 31, the prefilter and the rear filter acts to change the width of the compression band or the threshold value in response to the information of the quantizing means selected at the time of coding.

34. The orthogonal transform coding device according to claim 30 or 31, wherein the rear filter filters the signals between the frames or fields.

35. The orthogonal transform coding device according to claim 1, wherein the transmission means transmit the signals according to the order of importance at the time of reproducing.

36. The orthogonal transform coding device according to claim 32, the prefilter and the rear filter acts to change the width of the compression band or the threshold value in response to the information of the quantizing means selected at the time of coding.

37. The orthogonal transform coding device according to claim 32, wherein the rear filter filters the signals between the frames or fields.

38. The orthogonal transform coding device according to claim 33, wherein the rear filter filters the signals between the frames or fields.

39. The orthogonal transform coding device according to claim 35, wherein the rear filter filters the signals between the frames or fields.

* * * * *